US010725108B2

(12) United States Patent
Takahashi et al.

(10) Patent No.: US 10,725,108 B2
(45) Date of Patent: Jul. 28, 2020

(54) BATTERY STATUS ESTIMATING DEVICE

(71) Applicants: Kenji Takahashi, Toyota (JP); Yuji Nishi, Nagoya (JP); Nobuyasu Haga, Seto (JP)

(72) Inventors: Kenji Takahashi, Toyota (JP); Yuji Nishi, Nagoya (JP); Nobuyasu Haga, Seto (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 923 days.

(21) Appl. No.: 14/391,772

(22) PCT Filed: Dec. 20, 2012

(86) PCT No.: PCT/JP2012/083029
§ 371 (c)(1),
(2) Date: Oct. 10, 2014

(87) PCT Pub. No.: WO2013/153709
PCT Pub. Date: Oct. 17, 2013

(65) Prior Publication Data
US 2015/0112619 A1    Apr. 23, 2015

(30) Foreign Application Priority Data

Apr. 11, 2012 (JP) ................................. 2012-089907

(51) Int. Cl.
*G06F 17/40*    (2006.01)
*G06F 19/00*    (2011.01)
(Continued)

(52) U.S. Cl.
CPC ......... *G01R 31/3648* (2013.01); *G01K 13/00* (2013.01); *G01R 31/367* (2019.01);
(Continued)

(58) Field of Classification Search
None
See application file for complete search history.

(56) References Cited

U.S. PATENT DOCUMENTS 5,672,951 A * 9/1997 Shiota .................. G01R 31/361
320/132
5,691,621 A * 11/1997 Phuoc ................ G01R 31/3655
320/134
(Continued)

FOREIGN PATENT DOCUMENTS

JP    11-223665 A    8/1999
JP    2000-150003 A    5/2000
(Continued)

*Primary Examiner* — Alexander Satanovsky
*Assistant Examiner* — Brent A. Fairbanks
(74) *Attorney, Agent, or Firm* — Sughrue Mion, PLLC

(57) ABSTRACT

[Summary]
[Objective] Estimation accuracy in a battery status estimating device which estimates a charge status of a secondary battery should be improved further more.
[Means for Solution] In an SOC estimation by integration of a charge-and-discharge current, influence of a sensor error cannot be disregarded, and the influence of such an error is accumulated as time passes. On the other hand, in an SOC estimation based on measured values of a battery voltage and a battery temperature, estimation accuracy largely depends on a load-generation pattern. Then, in accordance with the present invention, by mixing both, while one of them is reset based on a reliability in accordance with an operation situation and/or an input current value which will be the premise for an SOC estimate calculation in a battery model is set up based on the reliability, it becomes possible to compute an SOC estimate in high accuracy as much as possible in accordance with the operation situation.

6 Claims, 13 Drawing Sheets

(51) Int. Cl.
  *G01R 31/36* (2020.01)
  *G01R 31/367* (2019.01)
  *G01R 31/382* (2019.01)
  *G01R 31/3828* (2019.01)
  *G01R 31/3835* (2019.01)
  *G01R 31/3842* (2019.01)
  *H01M 10/48* (2006.01)
  *G01K 13/00* (2006.01)
  *H01M 10/0525* (2010.01)
  *H02J 7/00* (2006.01)

(52) U.S. Cl.
  CPC ....... *G01R 31/382* (2019.01); *G01R 31/3828* (2019.01); *G01R 31/3835* (2019.01); *G01R 31/3842* (2019.01); *H01M 10/48* (2013.01); *G06F 17/40* (2013.01); *G06F 19/00* (2013.01); *H01M 10/0525* (2013.01); *H01M 2220/20* (2013.01); *H02J 7/0048* (2020.01); *Y02E 60/122* (2013.01)

(56) References Cited

U.S. PATENT DOCUMENTS

| | | | |
|---|---|---|---|
| 7,078,877 B2* | 7/2006 | Salasoo | H02J 7/0014 320/104 |
| 7,652,448 B2* | 1/2010 | Palladino | G01R 31/3651 320/104 |
| 8,008,891 B2* | 8/2011 | Yun | B60L 11/1861 320/132 |
| 8,093,902 B2* | 1/2012 | Nishi | G01R 31/3624 320/132 |
| 8,274,291 B2* | 9/2012 | Tsuchiya | G01R 31/3651 320/148 |
| 8,664,960 B2* | 3/2014 | Tsuchiya | G01R 31/3651 320/148 |
| 9,157,966 B2* | 10/2015 | Papana | G01R 31/3644 |
| 2003/0085688 A1* | 5/2003 | Ullrich | G01R 31/3828 320/132 |
| 2004/0162683 A1* | 8/2004 | Verbrugge | G01R 31/367 702/64 |
| 2005/0040789 A1* | 2/2005 | Salasoo | H02J 7/0014 320/119 |
| 2005/0154544 A1 | 7/2005 | Ono | |
| 2005/0269991 A1* | 12/2005 | Mitsui | G01R 31/3842 320/132 |
| 2006/0202857 A1 | 9/2006 | Kawahara et al. | |
| 2006/0232240 A1* | 10/2006 | Salasoo | H02J 7/0014 320/119 |
| 2007/0299620 A1* | 12/2007 | Yun | B60L 11/1861 702/63 |
| 2008/0015814 A1* | 1/2008 | Harvey, Jr. | G05B 19/41875 702/179 |
| 2009/0001992 A1* | 1/2009 | Tsuchiya | G01R 31/3675 324/426 |
| 2010/0000809 A1 | 1/2010 | Nishi et al. | |
| 2010/0033132 A1 | 2/2010 | Nishi et al. | |
| 2010/0085057 A1 | 4/2010 | Nishi et al. | |
| 2010/0153038 A1 | 6/2010 | Tomura et al. | |
| 2011/0161025 A1* | 6/2011 | Tonnura | H01M 10/48 702/63 |
| 2011/0257914 A1 | 10/2011 | Tsuchiya | |
| 2012/0109443 A1 | 5/2012 | Takahashi et al. | |
| 2013/0138369 A1* | 5/2013 | Papana | G01R 31/3644 702/63 |
| 2014/0236511 A1* | 8/2014 | Kulkarni | G01R 31/362 702/63 |

FOREIGN PATENT DOCUMENTS

| | | |
|---|---|---|
| JP | 2000-268886 A | 9/2000 |
| JP | 2003-75518 A | 3/2003 |
| JP | 2005-201743 A | 7/2005 |
| JP | 2007-141558 A | 6/2007 |
| JP | 2007-178215 A | 7/2007 |
| JP | 2007-192726 A | 8/2007 |
| JP | 2008-243373 A | 10/2008 |
| JP | 4265629 B2 | 5/2009 |
| JP | 2010-60406 A | 3/2010 |
| JP | 2010-271288 A | 12/2010 |
| JP | 4649682 B2 | 3/2011 |
| JP | 2011-85592 A | 4/2011 |
| JP | 4703593 B2 | 6/2011 |
| JP | 4744622 B2 | 8/2011 |
| JP | 2011-215151 A | 10/2011 |
| JP | 4802945 B2 | 10/2011 |
| JP | 4872743 B2 | 2/2012 |

* cited by examiner (i)

(ii)

(iii)

(i)

(ii)

(iii)

BATTERY STATUS ESTIMATING DEVICE

CROSS REFERENCE TO RELATED APPLICATIONS

This application is a National Stage of International Application No. PCT/JP2012/083029 filed Dec. 20, 2012, claiming priority based on Japanese Patent Application No. 2012-089907 filed Apr. 11, 2012, the contents of all of which are incorporated herein by reference in their entirety.

TECHNICAL FIELD

The present invention relates to a battery status estimating device (may be referred to as "a secondary battery status estimating device") configured so that charge status of a secondary battery might be estimated.

BACKGROUND ART

An electric power system which can supply electric power to a load using a secondary battery and charge the secondary battery, if needed, even when the load is in operation, is widely known (for instance, a hybrid car, an electric vehicle, etc.). In this kind of electric power system, in order to suppress the performance degradation of the above-mentioned secondary battery or to increase the efficiency of operation of the electric power system, various devices which estimate the charge status (SOC [%]: SOC is the abbreviation for State of Charge) of the above-mentioned secondary battery have been proposed conventionally.

For example, SOC can be estimated by integrating detection values of a current under charge and discharge of the above-mentioned secondary battery. However, by this technique, estimate of SOC may deviate from a true value since errors of current detection values are accumulated in the estimate of SOC.

Then, techniques for accurately estimating SOC by correcting SOC estimate obtained by integrating current detection values using SOC estimate otherwise computed based on an open circuit voltage, or carrying out weighted combination of both of them, have been proposed conventionally (for example, refer to Japanese Patent Application Laid-Open (kokai) No. H11-223665, Japanese Patent Application Laid-Open (kokai) No. 2000-150003, Japanese Patent Application Laid-Open (kokai) No. 2005-201743, Japanese Patent Application Laid-Open (kokai) No. 2007-192726 and Japanese Patent Application Laid-Open (kokai) No. 2008-243373, etc.).

CITATION LIST

Patent Literature

[PTL 1] Japanese Patent Application Laid-Open (kokai) No. H11-223665
[PTL 2] Japanese Patent Application Laid-Open (kokai) No. 2000-150003
[PTL 3] Japanese Patent Application Laid-Open (kokai) No. 2005-201743
[PTL 4] Japanese Patent Application Laid-Open (kokai) No. 2007-192726
[PTL 5] Japanese Patent Application Laid-Open (kokai) No. 2008-243373

SUMMARY OF INVENTION

The present invention has been conceived for the purpose of further improving estimation accuracy in this kind of battery status estimating device.

The battery status estimating device according to the present invention is configured so as to estimate charge status (will be simply referred to as "SOC" hereafter) of a secondary battery. This battery state estimating device comprises a voltage detector, a current detector, and a temperature detector. The above-mentioned voltage detector is prepared so as to detect a battery voltage which generates between terminals of the above-mentioned secondary battery. The above-mentioned current detector is prepared so as to detect a current under charge and discharge of the above-mentioned secondary battery. The above-mentioned temperature detector is prepared so as to detect a battery temperature which is a temperature of the above-mentioned secondary battery.

(1) A feature in one aspect of the present invention is in that the above-mentioned battery status estimating device further has a current estimating part, a reliability evaluating part, a model input current calculating part, and a charge status-estimating part.

The above-mentioned current estimating part is prepared so as to estimate the above-mentioned current by using a computational model which uses as parameters the above-mentioned battery voltage detected by the above-mentioned voltage detector and the above-mentioned battery temperature detected by the above-mentioned temperature detector.

Here, typically as the above-mentioned computational model, a well-known battery model may be used. This battery model is a computational model which contains at least a diffusion equation specifying a distribution of a reaction contributing substance (substance which contributes to an electrochemical reaction in said secondary battery). In addition, such battery models are particularly described in Japanese Patent No. 4265629, Japanese Patent No. 4649682, Japanese Patent No. 4703593, Japanese Patent No. 4744622, Japanese Patent No. 4802945, Japanese Patent No. 4872743 (Japanese Patent Application Laid-Open (kokai) No. 2008-243373), Japanese Patent Application Laid-Open (kokai) No. 2007-141558 and Japanese Patent Application Laid-Open (kokai) No. 2010-60406, etc. As this reaction contributing substance, when the above-mentioned secondary battery is what is called a lithium ion battery, an atom or ion of lithium corresponds to this.

Moreover, a well-known equivalent circuit model may be used as the above-mentioned computational model. This equivalent circuit model is a computational model using an equivalent circuit containing an RC parallel circuit which consists of a resistor Rs representing a pure electrical resistance, a resistor Rt representing a charge-transfer resistance and an electrical-double-layer capacity C (for instance, refer to Japanese Patent Application Laid-Open (kokai) No. 2000-268886, Japanese Patent Application Laid-Open (kokai) No. 2003-75518, Japanese Patent Application Laid-Open (kokai) No. 2007-178215 and Japanese Patent Application Laid-Open (kokai) No. 2011-215151).

The above-mentioned reliability evaluating part is configured so as to evaluate a reliability of a current value based on a charge-and-discharge condition of the above-mentioned secondary battery. Here, specifically, this reliability is a reliability of a detection value of the above-mentioned current by the above-mentioned current detector and an estimate of the above-mentioned current by the above-mentioned current estimating part.

The above-mentioned model input current calculating part is configured so as to compute a model input current according to an evaluation result by the above-mentioned reliability evaluating part. Here, the above-mentioned model input current is a current value used for the estimate of the above-mentioned charge status which uses the above-mentioned computational model.

The above-mentioned charge status-estimating part is configured so as to estimate the above-mentioned charge status using the above-mentioned computational model based on the above-mentioned model input current (this is computed by the above-mentioned model input current calculating part according to the above-mentioned evaluation result by the above-mentioned reliability evaluating part).

(2) A feature in another aspect of the present invention is in that the above-mentioned battery status estimating device has a primary estimate calculating part, a secondary estimate calculating part, a reliability evaluating part, a primary estimate resetting part and a secondary estimate resetting part, further.

The above-mentioned primary estimate calculating part is configured so as to sequentially compute a primary estimate (estimate of the above-mentioned charge status based on a detection value of the above-mentioned current by the above-mentioned current detector). Here, "sequentially computing" does not mean computing this time's calculation value separately from the last one independently, but means computing this time's calculation value on the premise of the last one (same applies to the below-mentioned "secondary estimate calculating part"). Specifically, this primary estimate calculating part is configured so as to sequentially compute the above-mentioned primary estimate by integrating the above-mentioned detection value of the above-mentioned current.

The above-mentioned secondary estimate calculating part is configured so as to sequentially compute a secondary estimate (estimate of the above-mentioned charge status) based on the above-mentioned battery voltage detected by the above-mentioned voltage detector and the above-mentioned battery temperature detected by the above-mentioned temperature detector. Specifically, for example, this secondary estimate calculating part is prepared so as to estimate the above-mentioned secondary estimate by using a computational model which uses as parameters the above-mentioned battery voltage detected by the above-mentioned voltage detector and the above-mentioned battery temperature detected by the above-mentioned temperature detector. It is possible to use a well-known battery model and equivalent circuit model as the above-mentioned computational model.

Here, the above-mentioned battery model is a computational model which contains at least a diffusion equation specifying a distribution of a reaction contributing substance (substance which contributes to an electrochemical reaction in the above-mentioned secondary battery) (refer to Japanese Patent No. 4265629, Japanese Patent No. 4649682, Japanese Patent No. 4703593, Japanese Patent No. 4744622, Japanese Patent No. 4802945, Japanese Patent No. 4872743 (Japanese Patent Application Laid-Open (kokai) No. 2008-243373), Japanese Patent Application Laid-Open (kokai) No. 2007-141558 and Japanese Patent Application Laid-Open (kokai) No. 2010-60406, etc.). Moreover, the above-mentioned equivalent circuit model is a computational model using an equivalent circuit containing an RC parallel circuit which consists of a resistor Rs representing a pure electrical resistance, a resistor Rt representing a charge-transfer resistance and an electrical-double-layer capacity C (for instance, refer to Japanese Patent Application Laid-Open (kokai) No. 2000-268886, Japanese Patent Application Laid-Open (kokai) No. 2003-75518, Japanese Patent Application Laid-Open (kokai) No. 2007-178215 and Japanese Patent Application Laid-Open (kokai) No. 2011-215151).

The above-mentioned reliability evaluating part is configured so as to evaluate reliabilities of the above-mentioned primary estimate and the above-mentioned secondary estimate based on a charge-and-discharge condition of the above-mentioned secondary battery. Here, as the above-mentioned charge-and-discharge condition, the above-mentioned current and the above-mentioned battery temperature, etc. may be used, for example.

The above-mentioned primary estimate resetting part is configured so as to reset the above-mentioned primary estimate calculating part (or the above-mentioned primary estimate) in order to continue a sequential calculation of the above-mentioned primary estimate by the above-mentioned primary estimate calculating part from a primary reset value set up based on the above-mentioned secondary estimate when the above-mentioned reliability evaluating part evaluates the reliability of the above-mentioned primary estimate as being low.

Here, "resetting" does not have a general semantic of resetting to an initial status (predetermined status at the time of a start-up or being brand new, etc.), but means to reset (replace) a value which will be a premise for the next calculation in a sequential calculation with a predetermined value introduced externally (same applies to a "secondary estimate resetting part" which will be mentioned later). In the above-mentioned case, specifically, for example, this primary estimate resetting part may be configured so as to set up the above-mentioned secondary estimate as the above-mentioned primary reset value and reset the primary estimate in order to continue a sequential calculation of the above-mentioned primary estimate on the premise of such a primary reset value.

The above-mentioned secondary estimate resetting part is configured so as to reset the above-mentioned secondary estimate calculating part in order to continue a sequential calculation of the above-mentioned secondary estimate by the above-mentioned secondary estimate calculating part from a secondary reset value set up based on the above-mentioned primary estimate when the above-mentioned reliability evaluating part evaluates a reliability of the above-mentioned secondary estimate low.

Specifically, when the above-mentioned secondary estimate calculating part is prepared so as to compute the above-mentioned secondary estimate based on the above-mentioned battery voltage detected by the above-mentioned voltage detector and the above-mentioned battery temperature detected by the above-mentioned temperature detector by estimating a concentration distribution and an average concentration of the reaction contributing substance in an active material containing the above-mentioned reaction contributing substance therein using the above-mentioned battery model, the above-mentioned secondary estimate resetting part is configured so as to updates the above-mentioned concentration distribution based on the above-mentioned primary estimate. In this case, for example, the above-mentioned secondary estimate resetting part may be configured so as to update the average concentration while holding a concentration variation pattern in the above-mentioned concentration distribution before resetting.

The above-mentioned battery status estimating device may be further equipped with a charge status calculating part. This charge status calculating part is configured so as to estimate the above-mentioned charge status by weighing the above-mentioned primary estimate and the above-mentioned secondary estimate using coefficients set up based on the evaluation result of the reliabilities of the above-mentioned primary estimate and the above-mentioned secondary estimate by the above-mentioned reliability evaluating part.

DESCRIPTION OF EMBODIMENTS

Hereafter, embodiments of the present invention will be explained, referring to drawings. In addition, as mentioned later, it is completely a natural that the present invention is not limited to specific configurations of the embodiments which will be explained below in any way. Since it may become difficult to understand the explanation of the embodiments if various kinds of variations (modifications) which may be given to the present embodiments were inserted during the explanation of the present embodiments, an explanation of the various variations of the embodiments are provided below.

—Whole Configuration of Electric Power System—

Figure 1:
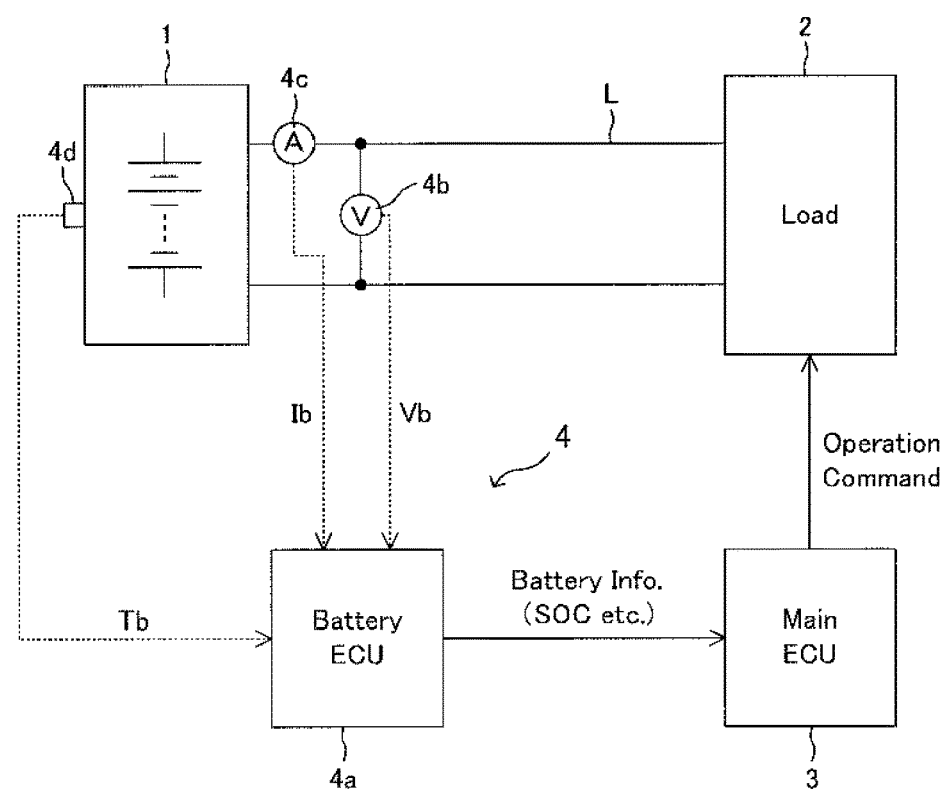
FIG. 1 A block diagram showing a schematic configuration of an electric power system to which one embodiment of the present invention is applied.

FIG. 1 is a block diagram showing a schematic configuration of an electric power system S to which one embodiment of the present invention is applied. The electric power system S is equipped with a secondary battery 1, a load mechanism 2, a main control unit 3 and a battery controller 4. While this electric power system S is configured so that it can supply a power supply to the load mechanism 2 with the secondary battery 1 and charge the secondary battery 1 with an electric power produced in an operation of the load mechanism 2, if needed, under control of the main control unit 3 (will be referred to as "main ECU3" hereafter).

In the present embodiment, the secondary battery 1 is a lithium ion battery which can be charged and discharged, and is electrically connected with the load mechanism 2 through a power-supply line L. Moreover, in the present embodiment, the electric power system S is a vehicle (an electric vehicle or hybrid vehicle) carrying a motor which is not shown. Namely, the load mechanism 2 is provided with driving elements, such as the motor driven with electric power supplied from the secondary battery 1, etc. Moreover, the load mechanism 2 is provided with a power-generation element (not shown: this power-generation element may include the above-mentioned motor) which can generate during the vehicle is running.

The main ECU3 is what is called a microcomputer including CPU (Central Processing Unit), ROM (Read Only Memory), RAM (Random Access Memory), Backup RAM (rewritable non-volatile memory), etc., and is configured so as to control a charge-and-discharge operation of the secondary battery 1 and an operation of the load mechanism 2, in accordance with battery information acquired from the battery controller 4 (variety of information about the secondary battery 1: battery voltage, battery temperature, SOC, etc.) and operation instruction information from a driver (operation amount of an accelerator pedal which is not shown, etc.).

The battery controller 4 is configured so as to estimate battery statuses (SOC etc.) of the secondary battery 1 in accordance with a battery model which can estimate an internal state of the secondary battery 1 based on an electrochemical reaction, and transmit to the main control unit 3 the above-mentioned battery information including this estimate. Specifically, the battery controller 4 is equipped with an electronic control unit 4a (will be referred to as "battery ECU4a" hereafter) for a battery control, a voltage sensor 4b, a current sensor 4c and a temperature sensor 4d.

Similarly to the above-mentioned main ECU3, the battery ECU4a is also what is called a microcomputer including CPU for executing a predetermined sequence and predetermined operation which were programmed beforehand, ROM storing a routine (program) and parameters for executing such sequence and operation, RAM and backup RAM suitably storing data when the CPU executes the routine, etc., and is configured so as to generate the above-mentioned battery information based on the detection signal (detection value) output by the voltage sensor 4b, the current sensor 4c and the temperature sensor 4d, etc. Details of specific configuration of this battery ECU4a will be mentioned later.

The voltage sensor 4b is prepared so as to produce output in accordance with the battery voltage which generates between terminals of the secondary battery 1. The current sensor 4c is prepared so as to produce output in accordance with the current under charge and discharge of the secondary battery 1 (will be referred to as a "charge-and-discharge current actual value Ib" hereafter). The temperature sensor 4d is prepared so as to produce output in accordance with the battery temperature which is a temperature of the secondary battery.

Figure 2:
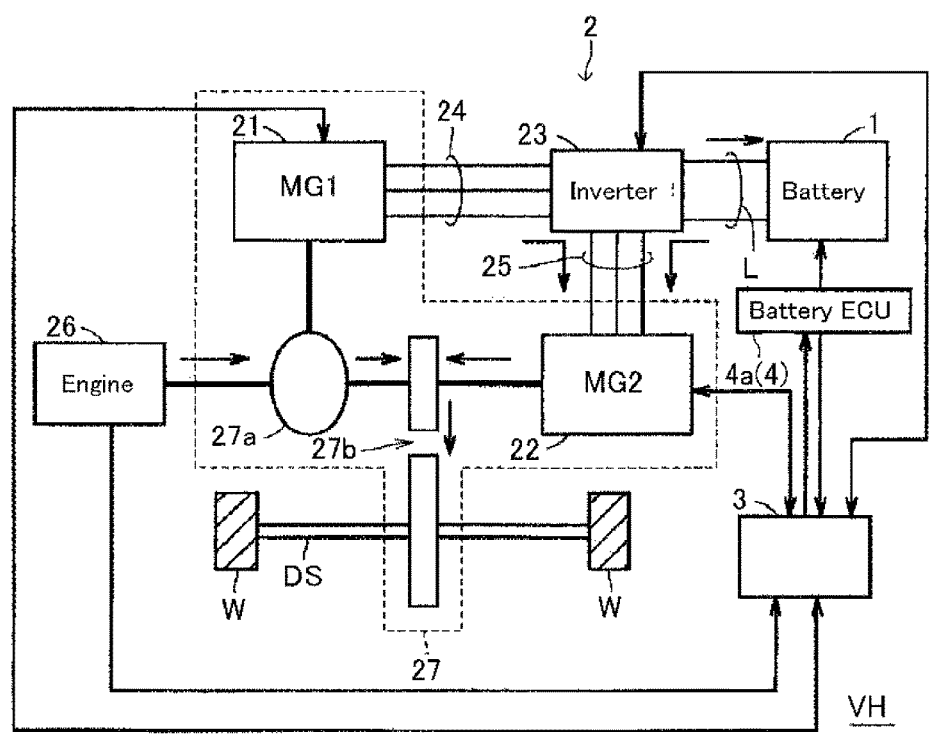
FIG. 2 A block diagram showing a schematic configuration of a vehicle with an electric motor mounted thereon as an example of the electric power system shown in FIG. 1.

FIG. 2 is a block diagram showing a schematic configuration of a vehicle with an electric motor mounted thereon as an example of an electric power system S shown in FIG. 1. As shown in FIG. 2, the electric motor-mounted vehicle VH is what is called a "hybrid vehicle", and has a primary motor generator 21, a secondary motor generator 22, an inverter 23, electric-power lines 24 and 25, an engine 26 and a motive-power transmission mechanism 27 as a load mechanism 2.

The primary motor generator 21 is a well-known alternative-current synchronous type generator motor which can operate as a dynamo and as an electric motor. This primary motor generator 21 is prepared so that it can generate electricity by receiving all or a part of a rotational driving force of the engine 26. In addition, in the present embodiment, the primary motor generator 21 is prepared so that it may function mainly as a dynamo.

The secondary motor generator 22 is a well-known alternative-current synchronous type generator motor which can operate as a dynamo and as an electric motor. This secondary motor generator 22 is prepared so that it can generate a motive power for rotating an axle shaft DS (wheel W) by receiving an electric power supply from the secondary battery 1 and/or the primary motor generator 21, while it can collect electric power from the rotational driving force of the axle shaft DS (wheel W) during deceleration.

The inverter 23 is electrically connected with the secondary battery 1 through power-supply line L. Moreover, the inverter 23 is electrically connected with the primary electromotor generator 21 through the electric-power line 24 and electrically connected with the secondary motor generator 22 through the electric-power line 25. This inverter 23 is configured so as to convert into an alternative-current electric power a DC electric power supplied from the secondary battery 1 and outputs it to the electric-power line 24, as well as convert into a DC electric power the alternative-current electric power supplied to the electric-power lines 24 and 25 and outputs it to power-supply line L.

The primary motor generator 21, the secondary motor generator 22 and the engine 26 are combined with the axle shaft DS (wheel W) through the motive-power transmission mechanism 27. The motive-power transmission mechanism 27 is equipped with a motive-power splitting mechanism 27a and a reducer 27b. The motive-power transmission mechanism 27 is configured so that it can make it possible to generate power in the primary motor generator 21 by transmitting all or a part of the rotational driving force outputted by the engine 26 to the primary motor generator 21 and it can drive the wheel W by transmitting the rotational driving force outputted by the engine 26 and the secondary motor generator 22 to the axle shaft DS.

Since the portions other than the battery ECU4a which is a principal part of the present embodiment in the configuration of an electric motor-mounted vehicle VH as mentioned above has been already well-known, detailed illustration beyond this about the configuration of the electric motor-mounted vehicle VH is omitted in the present specification.

—Configuration of Battery Status Estimating Device of First Embodiment—

Figure 3:
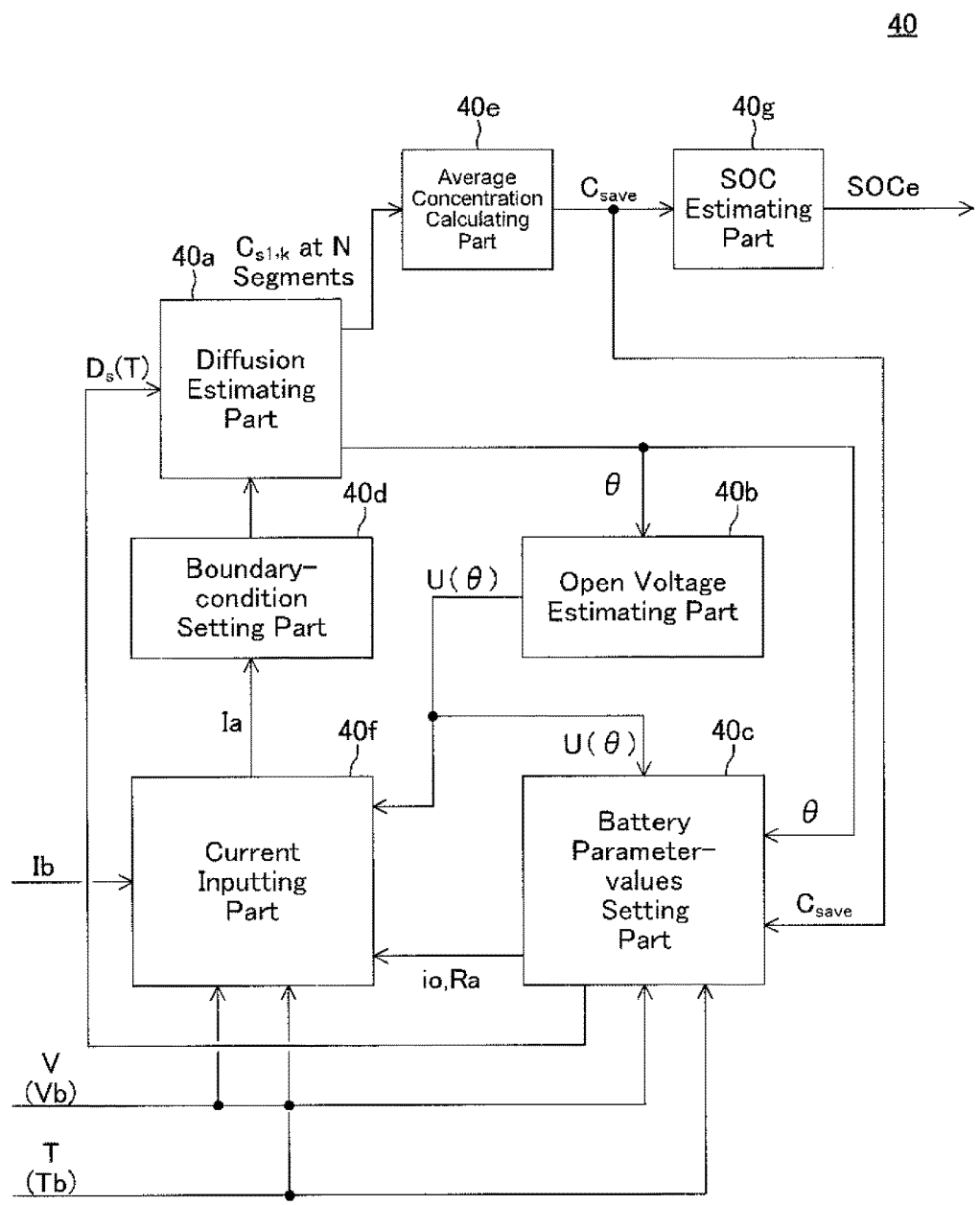
FIG. 3 A block diagram showing a rough functional scheme of a battery status estimating device according to one embodiment of the present invention which is attained within the electronic control unit for a battery control shown in FIG. 1 and FIG. 2.

FIG. 3 is a block diagram showing the rough functional scheme of the battery status estimating device 40 according to a first embodiment of the present invention attained within the battery ECU4a shown in FIG. 1 and FIG. 2.

Referring to FIG. 3, the battery status estimating device 40 according to the present embodiment is equipped with the diffusion estimating part 40a, an open voltage estimating part 40b, a battery parameter-values setting part 40c, a boundary-condition setting part 40d, an average concentration calculating part 40e, a current inputting part 40f and an SOC estimating part 40g.

The diffusion estimating part 40a is configured so as to sequentially calculate and update a lithium concentration distribution inside an active material, based on the boundary condition set up by the boundary-condition setting part 40d, using a well-known active-material diffusion model formula (for example, refer to Japanese Patent No. 4872743 (Japanese Patent Application Laid-Open (kokai) No. 2008-243373) by the present applicant). Since various kinds of model formulas in a battery model including the above-mentioned active-material diffusion model formula are similar to those disclosed in each of the above-mentioned official gazettes, details of a model formula used in each part, etc. is omitted in the present specification (if required, refer to each of the above-mentioned official gazettes).

The open voltage estimating part 40b is configured so as to compute an open voltage of each of a positive electrode and a negative electrode, or a composite open voltage of a positive electrode and a negative electrode in accordance with a predetermined map (in the drawings, these are indicated comprehensively as "open voltage $U(\theta)$". $U(\theta)$ means that an open voltage U is acquired using a map in which an open voltage U is represented as a function using "$\theta$" as an argument. Here, "$\theta$" is a local SOC. The "local SOC" is a local charging rate (SOC: State of Charge) based on a local lithium concentration distribution on the active-material surface estimated by the diffusion estimating part 40a.

The battery parameter-values setting part 40c is configured so as to set battery parameters (a DC pure resistance Ra, an exchange-current density $i_0$, a diffusion constant Ds, etc.) in a battery model formula to be used, in accordance with a battery temperature T detected according to a detection value Tb by the temperature sensor Td and a present local SOC based on an estimation by the diffusion estimating part 40a (indicated as "$\Theta$" in the drawings). Here, the diffusion constant Ds is a coefficient used for a diffusion equation which specifies a lithium concentration distribution in a battery model formula.

The boundary-condition setting part 40d is configured so as to convert into a reaction-current density (the amount of lithium formation) a model input current Ia outputted by the current input part 40f and update the boundary condition in the above-mentioned active-material diffusion model formula.

The average density calculation division 40e is configured so as to compute a lithium average concentration $C_{save}$ in a positive-electrode active-material model, based on a lithium concentration distribution inside the active material estimated by the diffusion estimating part 40a.

Figure 4:
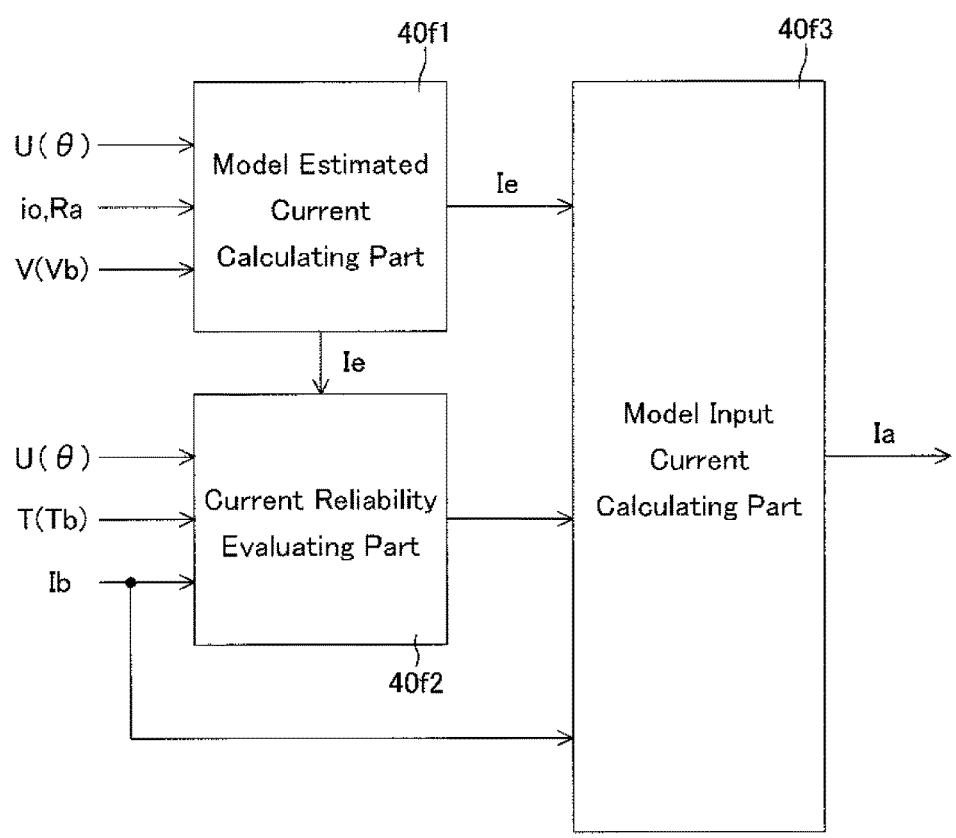
FIG. 4 A block diagram showing a rough functional scheme of the current input unit shown in FIG. 3 which is attained within the electronic control unit for a battery control shown in FIG. 1 and FIG. 2.

FIG. 4 is a block diagram showing a rough functional scheme of the current input part 40f shown in FIG. 3, which is attained within the battery ECU4a shown in FIG. 1 and FIG. 2. Referring to FIG. 4, the current input part 40f is equipped with a model estimated current calculating part 40f1, a current reliability evaluating part 40f2 and a model input current calculating part 40f3.

The current input part 40f is configured so as to evaluate a reliability of the above-mentioned estimated battery current Ie (this is computed using a battery model based on a battery voltage V detected in accordance with the detection value Vb of the voltage sensor 4b and the detection value Tb of temperature sensor 4d) and a reliability of a sensor current Ib (this is the detection value by the current sensor 4c) and, based on this evaluation result, compute and output a model input current Ia which is a current value inputted into the boundary-condition setting part 40d for a SOC estimation.

Specifically, the model estimated current calculating part 40f1 is configured so as to compute an estimated battery current Ie using a battery model, based on an open voltage U(θ) estimated by the open voltage estimating part 40b, a present battery voltage V detected in accordance with the detection value Vb of the voltage sensor 4b, and a well-known voltage-current relational model formula and active-material diffusion model formula.

Moreover, the current reliability evaluating part 40f2 is configured so as to evaluate a reliability of an estimated battery current Ie and a sensor current Ib based on a charge-and-discharge condition (a charge-and-discharge current actual value Ib, a battery temperature T and an open voltage U(θ), etc.) of the secondary battery 1. Specifically, the current reliability evaluating part 40f2 is configured so as to evaluate a reliability of the estimated battery current Ie and a sensor current Ib based on a table as follows (Table 1) beforehand stored in the above-mentioned ROM or backup RAM.

In addition, in the following table, a "duration" means a charge-and-discharge duration after the estimate of SOC is initialized last time, and an "OCV gradient" means the variation per unit time of the open voltage (OCV) sequentially estimated by the open voltage estimating part 40b. Moreover, "H" means that the reliability is high, and "L" means that the reliability is low.

TABLE 1

| | Charge-Discharge Current (Ib) | | Duration (tcont) | | Battery Temp. (Tb) | | OCV Gradient (ΔU) | |
|---|---|---|---|---|---|---|---|---|
| | <Ib0 | ≥Ib0 | <tc0 | ≥tc0 | <Tb0 | ≥Tb0 | <ΔU0 | ≥ΔU0 |
| Ib | L | H | H | L | H | H | H | H |
| Ie | H | L | H | H | L | H | L | H |

And the model input current calculating part 40f3 is configured so as to compute the model input current Ia, using the above-mentioned table (Table 1) and α in accordance with the evaluation result by the current reliability evaluating part 40f2, based on the following formula.

$$Ia = \alpha \times Ie + (1-\alpha) \times Ib$$

Referring to FIG. 3 again, the SOC estimating part 40g is configured so as to compute the battery charge status-estimation value SOCe (unit: %) which is an estimate of a final SOC, based on a lithium average concentration $C_{save}$ in a positive-electrode active-material model computed by the average concentration calculating part 40e. Namely, the SOC estimating part 40g is configured so as to compute the battery charge status-estimation value SOCe using a battery model, based on the model input current Ia computed as mentioned above by the model input current calculating part 40f3 in FIG. 4.

Figure 9:
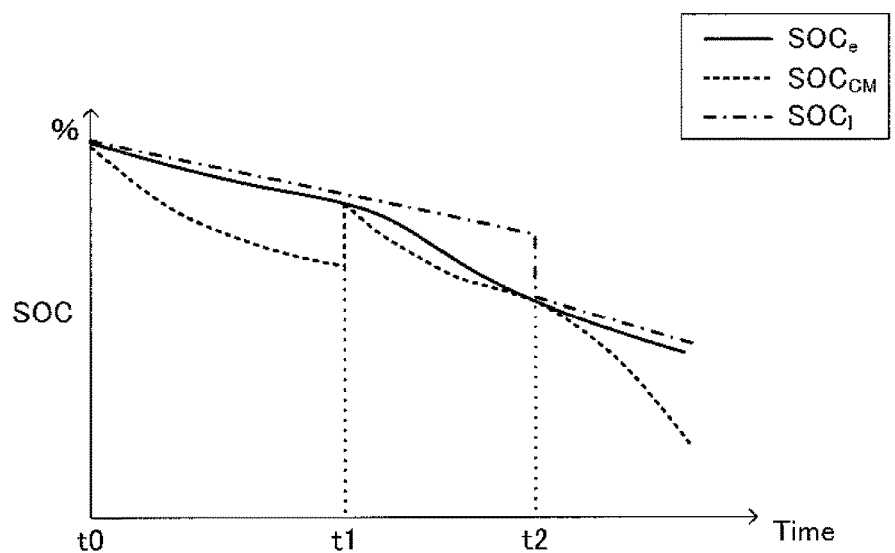
FIG. 9 A graph which shows an SOC estimating situation by an SOC estimating technique according to the present embodiment.
Figure 13:
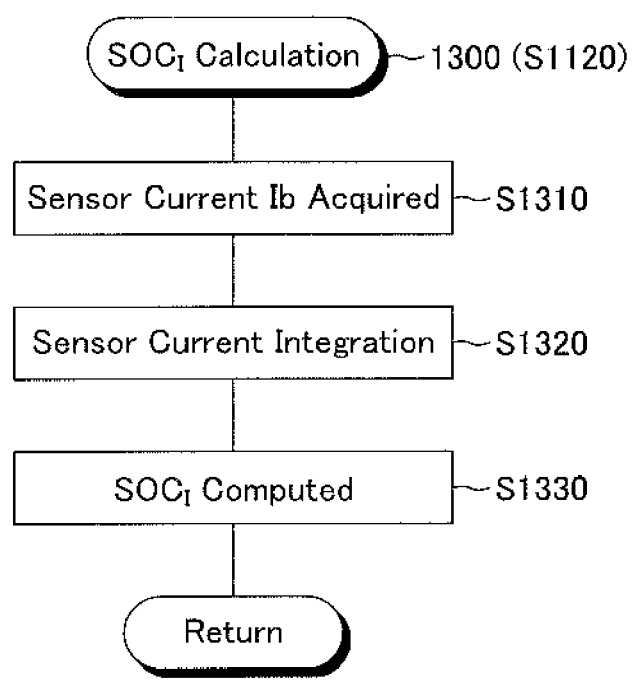
FIG. 13 A flowchart showing a calculating operation of an actual current-basis battery charge status-estimation value $SOC_I$ by the $SOC_I$ calculating part shown in FIG. 6.

In other words, the diffusion estimating part 40a, the boundary-condition setting part 40d, the average concentration calculating part 40e, and the SOC estimating part 40g have functions similar to those of a diffusion estimating part, a boundary-condition setting part, an average concentration calculating part and an SOC estimating part shown in FIG. 9 and FIG. 13 of Japanese Patent No. 4872743 (Japanese Patent Application Laid-Open (kokai) No. 2008-243373) by the present applicant, except that the model input current Ia outputted by the current input unit 40f is used in place of the estimated battery current Ie computed by the model estimated current calculating part 40f1.

—Outline of Operation, and Action and Effect—

Figure 5:
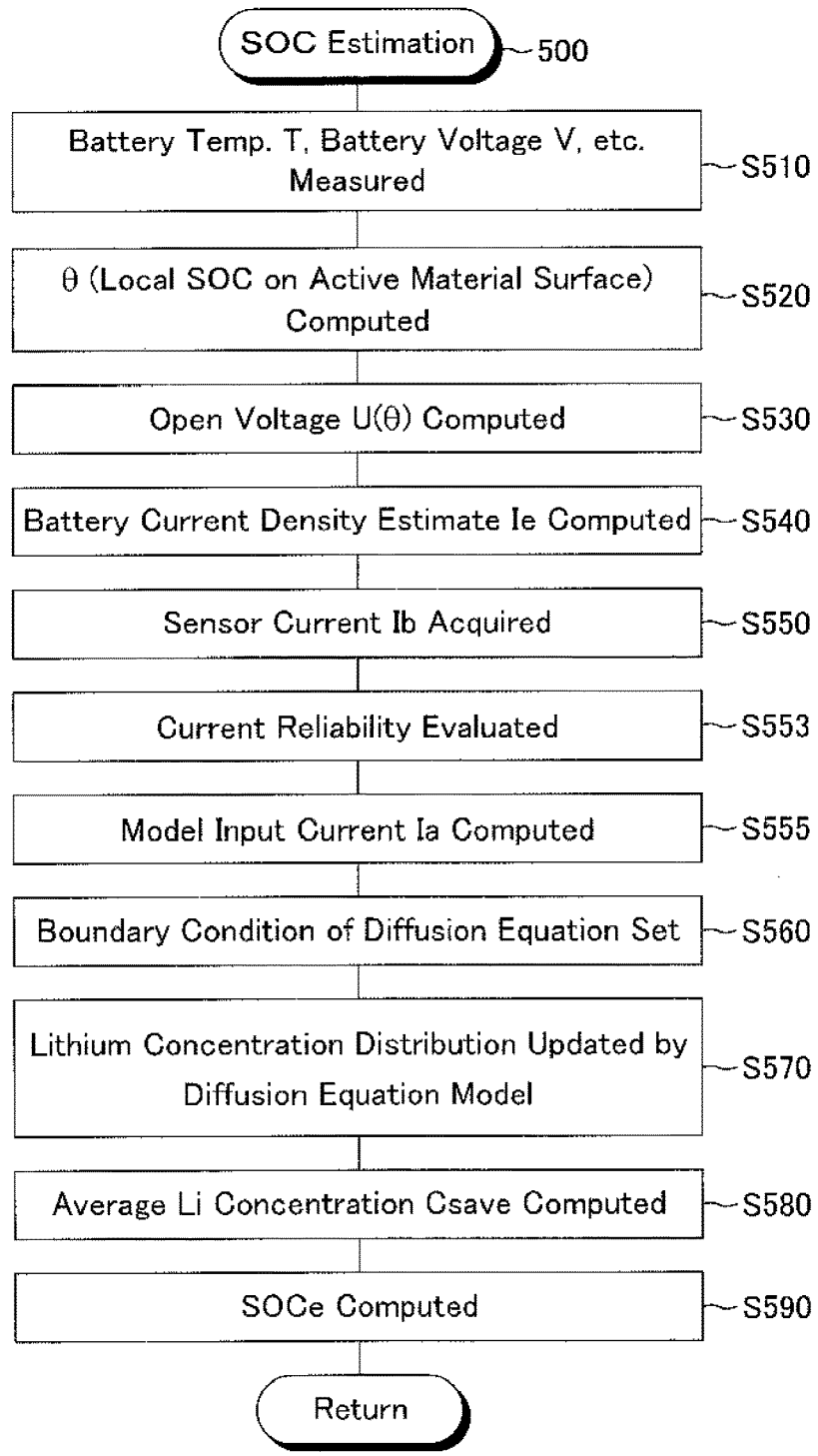
FIG. 5 A flowchart showing an example of an SOC estimating operation performed by the battery status estimating device shown in FIG. 3.

FIG. 5 is a flowchart showing an example of an SOC estimating operation performed by the battery state estimating device 40 shown in FIG. 3. In the figure, "S" is the abbreviation for a "step". The SOC estimation routine 500 shown in FIG. 5 is performed every predetermined operation period (for instance, 0.1 second) in the battery ECU4a.

Once this SOC estimation routine 500 starts up, first, in step 510, the battery temperature T and battery voltage V, etc. is acquired based on the detection values of various sensors (detection value Tb of the temperature sensor 4d and the detection value Vb of the voltage sensor 4b, etc.). Next, a processing proceeds to step 520. In step 520, the value (θ) of a local SOC on the surface of an active material is computed based on the lithium concentration distribution updated in step 570 which will be mentioned later at the time of the last routine execution.

Then, the processing proceeds to step 530. In step 530, an open voltage U(θ) value is computed based on the value of the local SOC computed at the above-mentioned step 520. Then, the processing proceeds to step 540 and step 550.

In step 540, the estimated battery current Ie is computed by the function of the model estimated current calculating part 40f1 shown in FIG. 4, based on battery parameter values set up in accordance with the battery voltage V, the open voltage U(θ) and the battery temperature T. On the other hand, in step 550, the sensor current Ib is acquired based on the output of the current sensor 4c.

Then, the processing proceeds to step 553. In step 553, a reliability of the estimated battery current Ie and the sensor current Ib is evaluated by the current reliability evaluating part 40f2, based on the charge-and-discharge conditions (a charge-and-discharge current actual value Ib, a battery temperature, etc.: refer to the above-mentioned Table 1) of the secondary battery 1.

Specifically in the present embodiment, the reliability of the estimated battery current Ie and the sensor current Ib is evaluated based on the following formulas.

$$\xi_{Ib} = \xi_{Ib1}(X_{Tb}) + \xi_{Ib2}(X_{tcont}) + \xi_{Ib3}(X_{Tb}) + \xi_{Ib4}(X_{\Delta U}), \text{ and}$$

$$\xi_{Ia} = \xi_{Ia1}(X_{Tb}) + \xi_{Ia2}(X_{tcont}) + \xi_{Ia3}(X_{Tb}) + \xi_{Ia4}(X_{\Delta U})$$

In the above formulas, $\xi_{Ib}$: coefficient of reliability of the sensor current Ib, $\xi_{Ia}$: coefficient of reliability of the estimated battery current Ie, $X_{Ib}$: reliability flag about magnitude of a charge-and-discharge current value (i.e., magnitude of load) (it is 1 in case of H in the above-mentioned Table 1, and 0 in case of L), $X_{tcont}$: reliability flag about a duration (it is 1 in case of H in the above-mentioned Table 1, and 0 in case of L), $X_{Tb}$: reliability flag about a battery temperature (it is 1 in case of H in the above-mentioned Table 1, and 0 in case of L), $X_{\Delta U}$: reliability flag about a OCV gradient (it is 1 in case of H in the above-mentioned Table 1, and 0 in case of L) and $\xi_{Ib1}, \xi_{Ib2}, \xi_{Ib3}, \xi_{Ib4}, \xi_{Ia1}, \xi_{Ia2}, \xi_{Ia3}, \xi_{Ia4}$: weighting coefficients (values beforehand stored in ROM or backup RAM: these values can be obtained beforehand by an experiment or a computer simulation).

Then, the processing proceeds to step 555. In step 555, the model input current Ia is computed based on the evaluation result in step 553. In the present embodiment, the above-mentioned α is set up based on the values of the above-mentioned $\xi_{Ib}$ and $\xi_{Ia}$, and a map beforehand stored in ROM or backup RAM (such a map can be beforehand obtained by an experiment or a computer simulation), and the model input current Ia is computed using this α.

Once the model input current Ia is thus calculated, the processing proceeds to step 560. In step 560, a reaction-current density (the amount of lithium formation) is computed from the model input current Ia, and the boundary condition (active-material surface) at an active-material interface of a diffusion model equation is set up using the computed reaction-current density.

Then, the processing proceeds to step 570. In step 570, the lithium concentration distribution in an active-material model is calculated by the diffusion-equation model, and the lithium concentration estimate in each region in an active-material model is updated. In addition, as mentioned above, the lithium concentration in a segmented region at the outermost circumference calculated and updated at this time is used for calculation of the local SOC in step 520 at the time of the next routine execution.

After the lithium concentration distribution is updated in step 570, the processing proceeds to step 580. In step 580, a lithium average concentration $C_{save}$ is computed based on the lithium concentration distribution in the active material obtained in step 570.

Then, the processing proceeds to step 590. In step 590, the battery charge status-estimation value SOCe which is an estimate of final SOC is computed based on the lithium average concentration $C_{save}$ obtained in step 580. Then, the processing of this routine is once completed.

As mentioned above, in the present embodiment, the model input current Ia, which forms the basis for calculation of the battery charge status-estimation value SOCe which is an estimate of final SOC, is computed based on the reliability evaluation result of the estimated battery current Ie and the sensor current Ib in accordance with the charge-and-discharge conditions of the secondary battery 1, and thereafter the battery charge status-estimation value SOCe is computed using this model input current Ia.

Therefore, in accordance with the configuration of the present embodiment, the computation load on estimation (calculation) is reduced, while the estimation (calculation) accuracy of SOC is improved better than ever before. Namely, in accordance with the present embodiment, the estimation accuracy of SOC is improved rather than ever before, while the estimation logic of SOC is simplified.

—Configuration of Battery Status Estimating Device of Second Embodiment—

Figure 6:
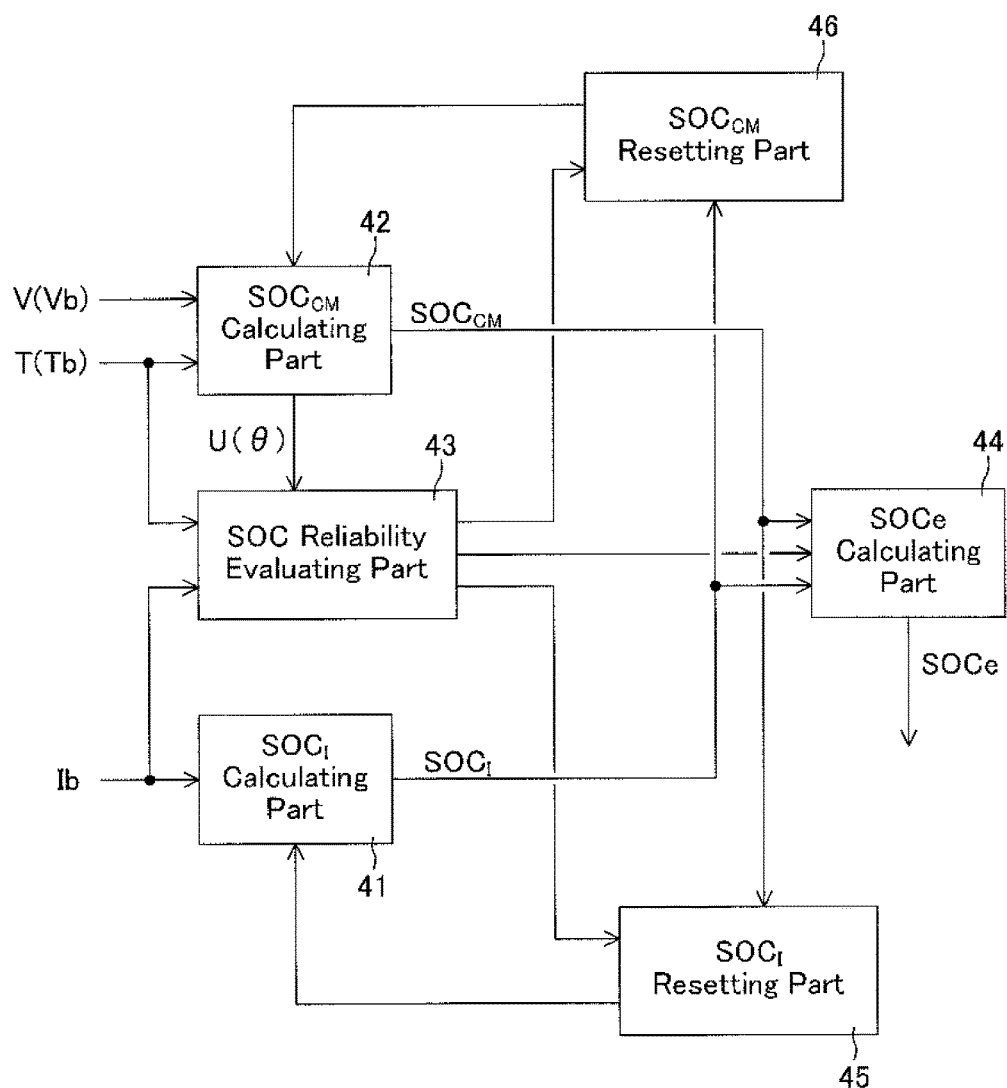
FIG. 6 A block diagram showing a rough functional scheme of a battery status estimating device according to another embodiment of the present invention which is attained within the electronic control unit for a battery control shown in FIG. 1 and FIG. 2.

FIG. 6 is a block diagram showing a rough functional scheme of the battery status estimating device 40 of one embodiment of the present invention attained within the battery ECU4a shown in FIG. 1 and FIG. 2. This battery status estimating device 40 is equipped with an $SOC_I$ calculating part 41, an $SOC_{CM}$ calculating part 42, an SOC reliability evaluating part 43, an SOCe calculating part 44, an $SOC_I$ resetting part 45 and an $SOC_{CM}$ resetting part 46.

The $SOC_I$ calculating part 41 is configured so as to sequentially compute the actual current-basis battery charge status-estimation value $SOC_I$ (unit: %) which is an estimate of SOC by integrating the charge-and-discharge current actual value Ib. In addition, since an estimation of SOC by integrating the charge-and-discharge current actual value Ib is well-known (for instance, refer to Japanese Patent Application Laid-Open (kokai) No. H11-223665, Japanese Patent Application Laid-Open (kokai) No. 2000-150003 Japanese Patent Application Laid-Open (kokai) No. 2005-201743, etc.). A detailed explanation of the circuit block inside the $SOC_I$ calculating part 41 is omitted in the present specification (if required, refer to each of the above-mentioned official gazettes, etc.).

The $SOC_{CM}$ calculating part 42 is prepared so as to sequentially compute an estimate of SOC (this will be referred to as a "model-basis battery charge status-estimation value $SOC_{CM}$" hereafter. unit: %) by a battery model, based on the battery voltage detected by the voltage sensor 4b and the battery temperature detected by the temperature sensor. A detailed explanation of the circuit block inside the $SOC_{CM}$ calculating part 42 will be mentioned later.

The SOC reliability evaluating part 43 is configured so as to evaluate the reliability of the actual current-basis battery charge status-estimation value $SOC_I$ and the model-basis battery charge status-estimation value $SOC_{CM}$ based on the charge-and-discharge conditions (the charge-and-discharge current actual value Ib, a battery temperature and an open voltage U(θ)) of the secondary battery 1. Specifically, the SOC reliability evaluating part 43 is configured so as to evaluate the reliability of the actual current-basis battery charge status-estimation value $SOC_I$ and the model-basis battery charge state-estimation value $SOC_{CM}$ based on a table as follows (Table 2) beforehand stored in the above-mentioned ROM or backup RAM.

In addition, in the following table, a "duration" means a charge-and-discharge duration after the estimate of SOC is initialized last time (i.e., a duration from a calculation initiation of the actual current-basis battery charge status-estimation value $SOC_I$), and an "OCV gradient" means the variation per unit time of the open voltage (OCV) sequentially estimated at the time of calculation of the model-basis battery charge state-estimation value $SOC_{CM}$ in the $SOC_{CM}$ calculating part 42. Moreover, "H" means that the reliability is high, and "L" means that the reliability is low. The value "Ib" corresponds to the sensor current and the value "Ie" corresponds to the estimated battery current.

TABLE 2

| | Charge-Discharge Current (Ib) | | Duration (tcont) | | Battery Temp. (Tb) | | OCV Gradient (ΔU) | |
|---|---|---|---|---|---|---|---|---|
| | <Ib0 | ≥Ib0 | <tc0 | ≥tc0 | <Tb0 | ≥Tb0 | <ΔU0 | ≥ΔU0 |
| $SOC_I$ | L | H | H | L | H | H | H | H |
| $SOC_{CM}$ | H | L | H | H | L | H | L | H |

The SOCe calculating part 44 is configured so as to compute the battery charge state-estimation value SOCe (unit: %) which is an estimate of final SOC based on the actual current-basis battery charge status-estimation value $SOC_I$ computed by the $SOC_I$ calculating part 41, the model-basis battery charge status-estimation value $SOC_{CM}$ computed by the $SOC_{CM}$ calculating part 42 and the evaluation results of these reliabilities by the SOC reliability evaluating part 43. Specifically, the SOCe calculating part 44 is configured so as to compute the battery charge status-estimation value SOCe using the coefficient α set up based on the evaluation result by the SOC reliability evaluating part 43, based on the following formulas.

$$SOCe = \alpha \times SOC_{CM} + (1-\alpha) \times SOC_I$$

The $SOC_I$ resetting part 45 is configured so as to reset the $SOC_I$ calculating part 41 (or the actual current-basis battery charge status-estimation value $SOC_I$), in order to continue serial calculation of the actual current-basis battery charge status-estimation value $SOC_I$ by the $SOC_I$ calculating part 41 from a reset value $SOC_{I\_reset}$ set up based on the model-basis battery charge status-estimation value $SOC_{CM}$, when it is judged that the reliability of the actual current-basis battery charge status-estimation value $SOC_I$ is low by the SOC reliability evaluating part 43.

Specifically, in the present embodiment, the $SOC_I$ resetting part 45 is configured so as to set up the model-basis battery charge status-estimation value $SOC_{CM}$ as the reset value $SOC_{I\_reset}$, and reset the actual current-basis battery charge status-estimation value $SOC_I$ concerned in order to continue a sequential calculation of the actual current-basis battery charge status-estimation value $SOC_I$ on the premise of this reset value $SOC_{I\_reset}$, when it is evaluated that the reliability of the actual current-basis battery charge status-estimation value $SOC_I$ is low.

The $SOC_{CM}$ resetting part 46 is configured so as to reset the $SOC_{CM}$ calculating part 42 in order to continue a sequential calculation of the model-basis battery charge status-estimation value $SOC_{CM}$ by the $SOC_{CM}$ calculating part 42 from the reset value $SOC_{CM\_reset}$ set up based on the actual current-basis battery charge status-estimation value $SOC_I$, when it is evaluated that the reliability of the model-basis battery charge status-estimation value $SOC_{CM}$ is low by the SOC reliability evaluating part 43.

Specifically, in the present embodiment, the $SOC_{CM}$ resetting part 46 is configured so as to reset the $SOC_{CM}$ calculating part 42 by updating the average concentration while holding the concentration variation pattern in the lithium concentration distribution in an active material, which is estimated during calculation of the model-basis battery charge status-estimation value $SOC_{CM}$ in the $SOC_{CM}$ calculating part 42.

Figure 7:
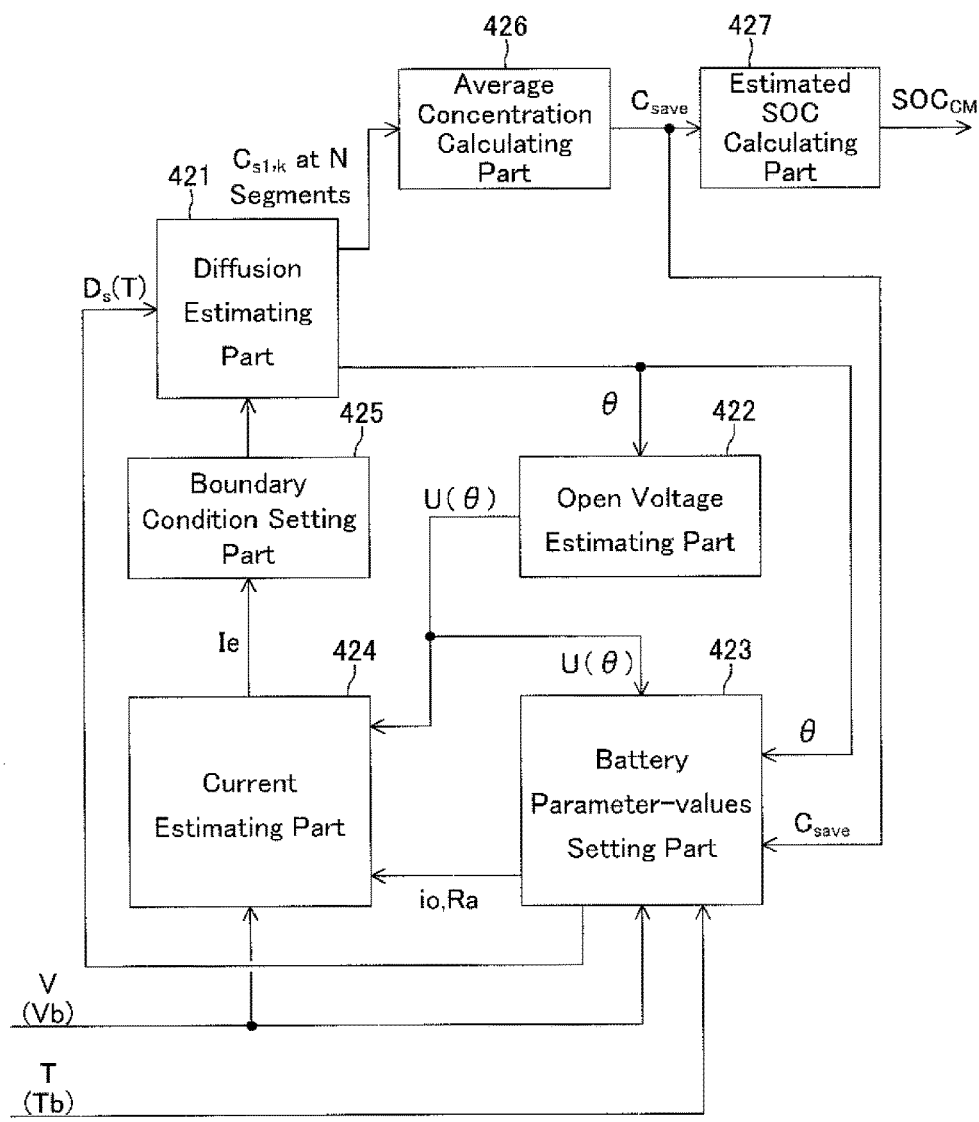
FIG. 7 A block diagram showing a rough functional scheme of the $SOC_{CM}$ calculating part shown in FIG. 6 which is attained within the electronic control unit for a battery control shown in FIG. 1 and FIG. 2.

FIG. 7 is a block diagram showing a rough functional scheme of the $SOC_{CM}$ calculating part 42 shown in FIG. 6 attained within the battery ECU4a shown in FIG. 1 and FIG. 2. Referring to FIG. 7, the $SOC_{CM}$ calculating part 42 is equipped with a diffusion estimating part 421, an open voltage estimating part 422, a battery parameter-values setting part 423, a current estimating part 424, a boundary-condition setting part 425, an average concentration calculating part 426 and a model-basis estimated SOC calculating part 427.

In addition, these are similar to those disclosed in each of the above-mentioned official gazettes using a well-known battery model (for example, refer to FIG. 9 and FIG. 13 of Japanese Patent No. 4872743 (Japanese Patent Application Laid-Open (kokai) No. 2008-243373) by the present applicant). Therefore, detail, such as a model formula used in these, etc. is omitted in the present specification (if required, refer to each of the above-mentioned official gazettes).

The diffusion estimating part 421 is configured so as to sequentially calculate and update the lithium concentration distribution inside the active material, based on the boundary condition set up by the boundary-condition setting part, by a well-known active-material diffusion model formula.

The open voltage estimating part 422 is configured so as to compute an open voltage of each of a positive electrode and a negative electrode, or a composite open voltage of a positive electrode and a negative electrode in accordance with a predetermined map (in the drawings, these are indicated comprehensively as "open voltage U(θ)". U(θ) means that an open voltage U is acquired using a map in which an open voltage U is represented as a function using "θ" as an argument. Here, "θ" is a local SOC. The "local SOC" is a local charging rate (SOC: State of Charge) based on a local lithium concentration distribution on the active-material surface estimated by the diffusion estimating part 421.

The battery parameter-values setting part 423 is configured so as to set battery parameters (a DC pure resistance Ra, an exchange-current density $i_0$, a diffusion constant Ds, etc.) in a battery model formula to be used, in accordance with a battery temperature T detected according to a detection value Tb by the temperature sensor Td and a present local SOC based on an estimation by the diffusion estimating part 421 (indicated as "θ" in the drawings). Here, the diffusion constant Ds is a coefficient used for a diffusion equation which specifies a lithium concentration distribution in a battery model formula.

The current estimating part 424 is configured so as to compute the estimated battery current Ie based on the open voltage U(θ) estimated by the open voltage estimating part 422, the present battery voltage V detected in accordance with the detection value Vb of the voltage sensor 4b, and a well-known voltage-current relational model formula and active-material diffusion model formula.

The boundary-condition setting part 425 is configured so as to convert into a reaction-current density (the amount of lithium formation) the estimated battery current Ie computed by the current estimating part 424, and update the boundary condition of the active-material diffusion model formula.

The average concentration calculating part 426 is configured so as to compute the lithium average concentration $C_{save}$ in the positive-electrode active-material model, based on the lithium concentration distribution inside the active material estimated by the diffusion estimating part 421.

The model-basis estimated SOC calculating part 427 is configured so as to compute the model-basis battery charge status-estimation value $SOC_{CM}$ based on the lithium average concentration $C_{save}$ computed by the average concentration calculating part 426.

—Outline of Operation, and Action and Effect—

Figure 8:
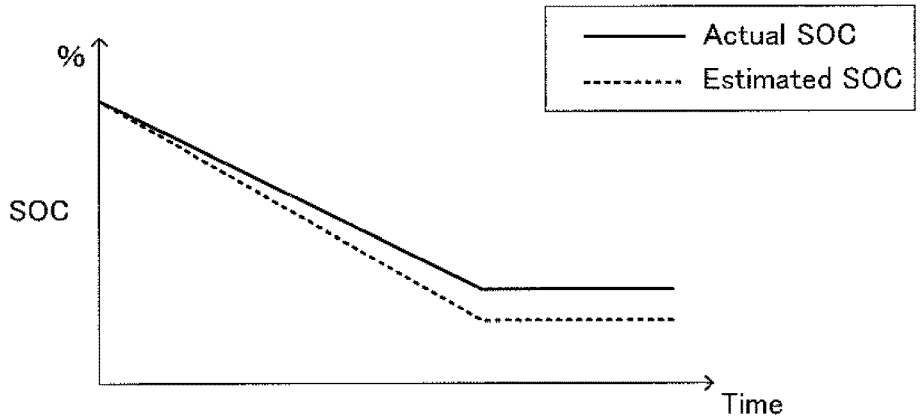
FIG. 8 A graph which shows an SOC estimating situation in a conventional SOC estimating technique.
Figure 8:
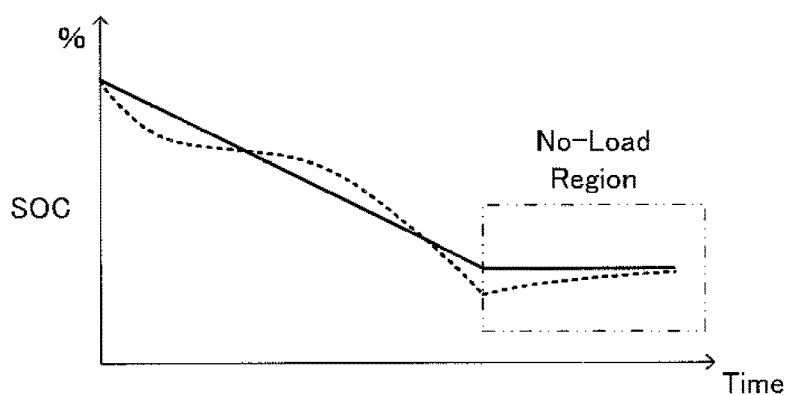
Figure 8:
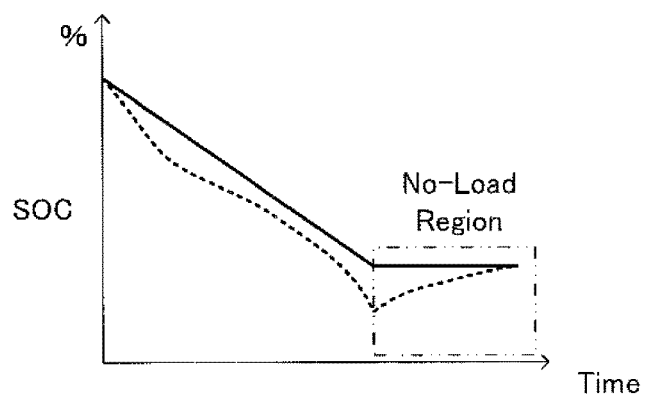

Hereafter, the outline of the SOC estimation by the above-mentioned configuration will be explained, referring to FIG. 8, FIG. 9, and FIG. 10. FIG. 8 is a graph which shows an SOC estimating situation in a conventional SOC estimating technique. Here, in this figure, a dashed line shows the time course of the estimate of SOC, and a solid line shows the time course of actual SOC. First, the SOC estimating situation in a conventional SOC estimating technique will be explained using FIG. 8.

The SOC estimating technique by integrating a charge-and-discharge current (calculation of the actual current-basis battery charge status-estimation value $SOC_I$ by the above-mentioned $SOC_I$ calculating part 41) estimates SOC, monitoring the actual charge-and-discharge current of the secondary battery 1. Moreover, in such a technique, the dependency of estimation accuracy of a SOC on a load-generation pattern is small. Therefore, in accordance with such a technique, it is possible to estimate SOC in a very high accuracy, when there is no current measurement error by the current sensor 4c.

However, in practice, the influence of a current measurement error by the current sensor 4c cannot be disregarded. Moreover, the SOC estimation error under the influence of this error is accumulated with passage of time as shown by (i) in the figure.

On the contrary, in the SOC estimating technique based on the measured values of a battery voltage and battery temperature (calculation of the model-basis battery charge status-estimation value $SOC_{CM}$ by the above-mentioned $SOC_{CM}$ calculating part 42), no accumulation of a sensor error occurs. Moreover, in such a technique, an SOC estimate approaches asymptotically to an actual value under an unloaded condition (a current is zero), and both correspond to each other when the secondary battery 1 is fully relaxed.

However, in such a technique, as apparent from the contrast between the low-load pattern shown by (ii) and the high-load pattern shown by (iii) in the figure, the dependency of estimation accuracy of an SOC on the load-generation pattern is large.

In this connection, it seemingly appears that a technique in which both are simply mixed (Japanese Patent Application Laid-Open (kokai) No. H11-223665, Japanese Patent Application Laid-Open (kokai) No. 2000-150003, Japanese Patent Application Laid-Open (kokai) No. 2005-201743, and Japanese Patent Application Laid-Open (kokai) No. 2008-243373, etc.) can solve the defects of both. However, even in accordance with such a technique, the influence by an accumulation of the sensor error accompanying passage of time and variation of a load-generation pattern also reaches the accuracy of a final SOC estimate.

Therefore, in the technique in which both are simply mixed, the accuracy of a final SOC estimate may get worse by a variation of a load pattern and passage of time. Especially, in such a technique, as for the SOC estimation accuracy near the upper and lower limits of an available range of SOC (i.e., near the end of charge and discharge), due to the influence of an accumulation of the sensor error accompanying passage of time, an SOC point estimate based on the measured value of a battery voltage and a battery temperature must be used after all, and significance for mixing with the SOC estimate by the integration of a charge-and-discharge current will be reduced.

FIG. 9 is a graph which shows an SOC estimating situation by an SOC estimating technique according to the present embodiment. Here, in this figure, the alternate long and short dash line shows the time course of the actual current-basis battery charge status-estimation value $SOC_I$ by the above-mentioned $SOC_I$ calculating part 41, the dashed line shows the time course of the model-basis battery charge status-estimation value $SOC_{CM}$ by the above-mentioned $SOC_{CM}$ calculating part 42, and a full line shows the time course of the battery charge status-estimation value SOCe by the SOCe calculating part 44.

As shown in FIG. 9, in the SOC estimating technique according to the present embodiment, between the time t0 and t1 when the reliability of the actual current-basis battery charge status-estimation value $SOC_I$ by the $SOC_I$ calculating part 41 is high, and after the time t2, the actual current-basis battery charge status-estimation value $SOC_I$ is largely "weighed". In the meantime, the model-basis battery charge status-estimation value $SOC_{CM}$ by the $SOC_{CM}$ calculating part 42 deviates from the battery charge status-estimation value SOCe gradually.

On the other hand, between the time t1 and t2 when the reliability of the model-basis battery charge status-estimation value $SOC_{CM}$ by the $SOC_{CM}$ calculating part 42 is high, the model-basis battery charge status-estimation value $SOC_{CM}$ is largely "weighed". In the meantime, the actual current-basis battery charge status-estimation value $SOC_I$ by the $SOC_I$ calculating part 41 deviates from the battery charge status-estimation value SOCe gradually.

Furthermore, in the SOC estimating technique according to the present embodiment, when the reduction of the reliability of the model-basis battery charge status-estimation value $SOC_{CM}$ by the $SOC_{CM}$ calculating part 42 reaches a predetermined extent (for example, when the deviation between the model-basis battery charge status-estimation value $SOC_{CM}$ and the battery charge status-estimation value SOCe exceeds a predetermined value: Refer to the time t1), the $SOC_{CM}$ calculating part 42 is reset by the above-mentioned reset value $SOC_{CM\_reset}$ based on the actual current-basis battery charge status-estimation value $SOC_I$ at the time. Thereby, from the time t1, calculation of the model-basis battery charge status-estimation value $SOC_{CM}$ by the $SOC_{CM}$ calculating part 42 is continued based on this reset value $SOC_{CM\_reset}$.

On the other hand, when the reduction of the reliability of the actual current-basis battery charge status-estimation value $SOC_I$ by the $SOC_I$ calculating part 41 reaches a predetermined extent (for example, when the deviation between the actual current-basis battery charge status-estimation value $SOC_I$ and the battery charge status-estimation value SOCe exceeds a predetermined value: Refer to the time t2), the actual current-basis battery charge status-estimation value $SOC_I$ is reset by the above-mentioned reset value $SOC_{I\_reset}$ based on the model-basis battery charge status-estimation value $SOC_{CM}$ at the time. Thereby, from the time t2, calculation of the actual current-basis battery charge status-estimation value $SOC_I$ by the $SOC_I$ calculating part 41 is continued based on this reset value $SOC_{I\_reset}$.

Thus, in the SOC estimating technique according to the present embodiment, when the reduction of the reliability reaches a predetermined extent, the $SOC_I$ calculating part 41 or the $SOC_{CM}$ calculating part 42 is reset suitably. Therefore, in accordance with the SOC estimating technique according to the present embodiment, it becomes possible to compute the battery charge status-estimation value SOCe in high accuracy as much as possible in accordance with an operation situation.

Figure 10:
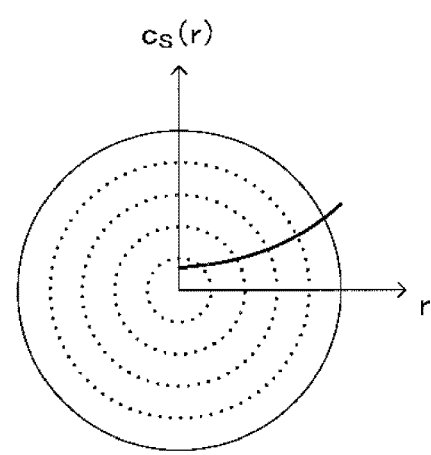
FIG. 10 A conceptual diagram showing a lithium concentration distribution in a positive-electrode active material within the secondary battery shown in FIG. 1.
Figure 10:
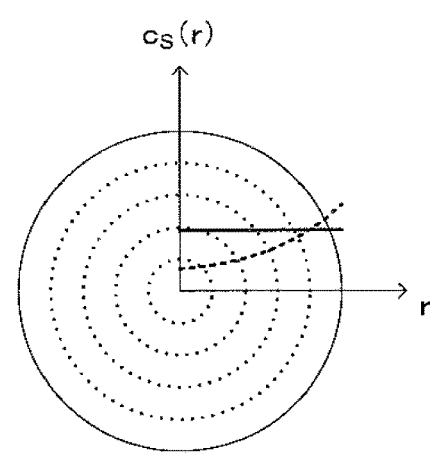
Figure 10:
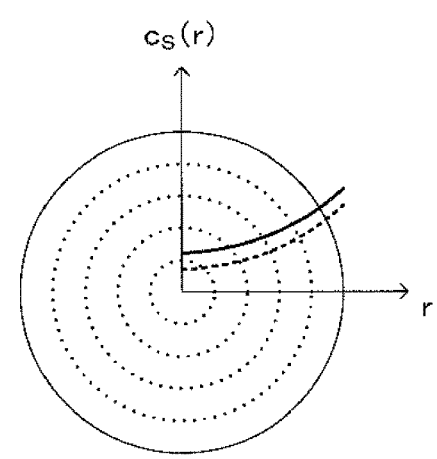

Here, FIG. 10 is a conceptual diagram showing a lithium concentration distribution in a positive-electrode active material within the secondary battery shown in FIG. 1. Here, in this figure, (i) shows a lithium concentration distribution just before resetting the $SOC_{CM}$ calculating part 42. Moreover, (ii) and (iii) in this figure show the lithium concentration distributions after resetting.

As mentioned above, the model-basis battery charge status-estimation value $SOC_{CM}$ is computed by the model-basis estimated SOC calculating part 427 based on the lithium concentration distribution inside the active material estimated by the diffusion estimate division 421 and the lithium average concentration $C_{save}$ in the positive-electrode active-material model estimated by the average concentration calculating part 426.

Therefore, when the $SOC_{CM}$ calculating part 42 is reset based on the actual current-basis battery charge status-estimation value $SOC_I$, it is possible to replace the lithium concentration distribution shown in (i) in FIG. 10 with the lithium average concentration $C_{save}$ calculated backward based on the actual current-basis battery charge status-estimation value $SOC_I$ at the time (refer to (ii) in FIG. 10).

By the way, as already well-known, in the $SOC_{CM}$ calculating part 42, by solving a diffusion equation, the lithium concentration distribution inside the active material is estimated (calculated) momentarily, and especially its surface concentration serves as an important variable which determines a reaction resistance and an open voltage. For this reason, if the lithium concentration distribution inside an active material were reset (replaced) with the lithium average concentration $C_{save}$ calculated backward based on the actual current-basis battery charge status-estimation value $SOC_I$ to a uniform distribution as shown in (ii) in FIG. 10, the accuracy of the model-basis battery charge status-estimation value $SOC_{CM}$ by the $SOC_{CM}$ calculating part 42 may get worse in the short term.

Then, when the $SOC_{CM}$ calculating part 42 is reset, it is suitable to reset (replace) the lithium concentration distribution in an active material so that the average concentration may be updated, holding the concentration variation pattern just before resetting (refer to the dashed line in the figure) as shown in (iii) in FIG. 10. Thereby, the temporary reduction in the accuracy of the model-basis battery charge status-estimation value $SOC_{CM}$ accompanying reset of the lithium concentration distribution in an active material is suppressed successfully.

—Specific Example of Operation—

Figure 11:
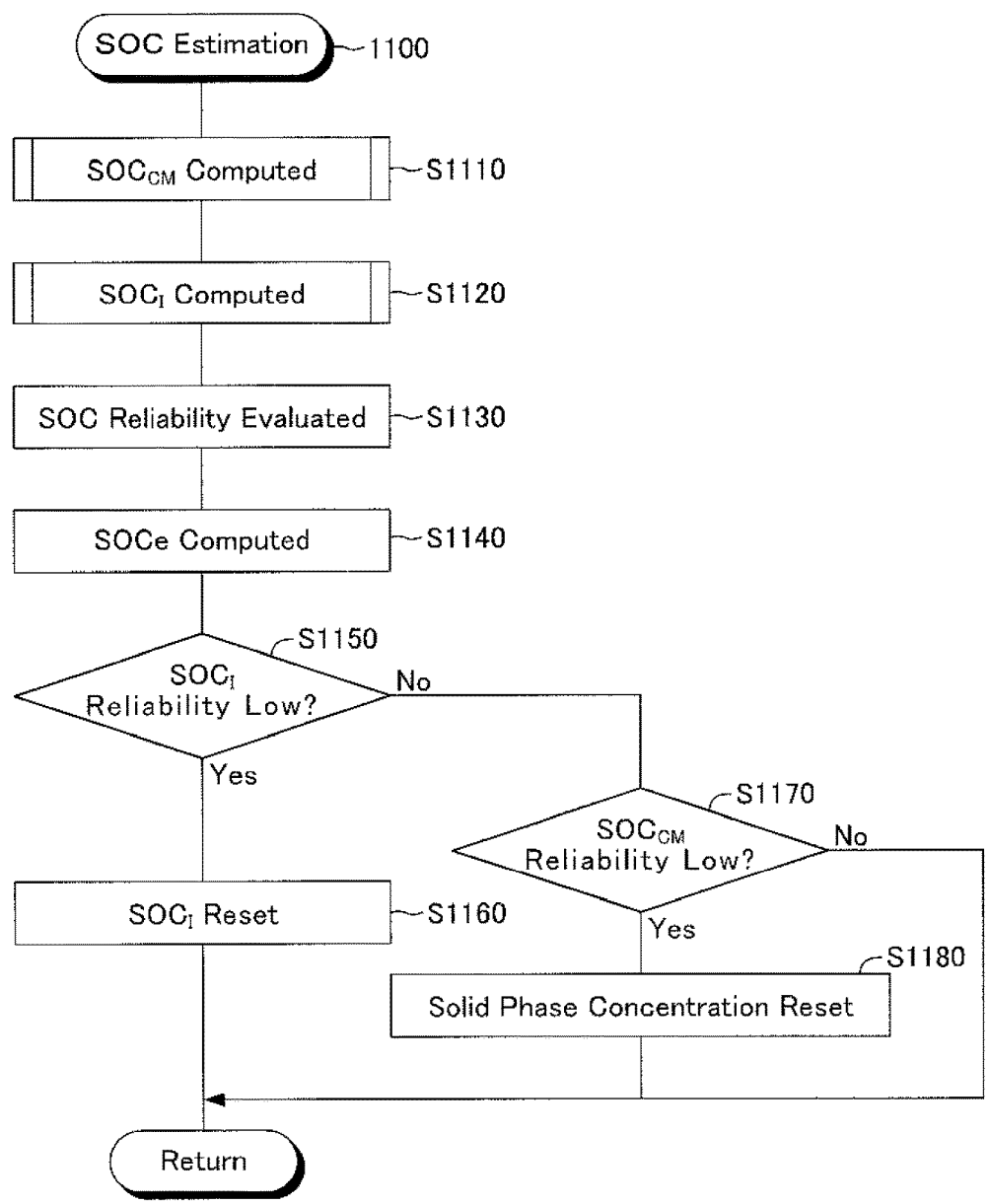
FIG. 11 A flowchart showing a specific example of an SOC estimating operation which is performed by the battery status estimating device shown in FIG. 6.

FIG. 11 is a flowchart showing a specific example of an SOC estimating operation which is performed by the battery status estimating device 40 shown in FIG. 6. In the figure, "S" is the abbreviation for a "step" (same applies to FIG. 12 and FIG. 13). The SOC estimation routine 1100 shown in FIG. 11 is performed every predetermined operation period (for instance, 0.1 second) in the battery ECU4a.

Once this SOC estimation routine 1100 is started, first, in step 1110, the model-basis battery charge status-estimation value $SOC_{CM}$ will be computed by the $SOC_{CM}$ calculating part 42 (refer to an explanation of the routine 1200 in the below-mentioned FIG. 12 for details). Moreover, in step 1120, the actual current-basis battery charge status-estimation value $SOC_I$ is computed by the $SOC_I$ calculating part 41 (refer to an explanation of the routine 1300 in the below-mentioned FIG. 13 for details).

Next, a processing proceeds to step 1130. In step 1130, the reliability of the actual current-basis battery charge status-estimation value $SOC_I$ and the model-basis battery charge status-estimation value $SOC_{CM}$ is evaluated by the SOC reliability evaluating part 43, based on the charge-and-discharge conditions of the secondary battery 1 (the charge-and-discharge current actual value Ib, a battery temperature, etc.: refer to the above-mentioned Table 2).

Specifically, in the present embodiment, the reliability of the actual current-basis battery charge status-estimation value $SOC_I$ and the model-basis battery charge status-estimation value $SOC_{CM}$ is judged based on the following formulas.

$$\xi_I = \xi_{I1}(X_{Ib}) + \xi_{I2}(X_{tcont}) + \xi_{I3}(X_{Tb}) + \xi_{I4}(X_{\Delta U}), \text{ and}$$

$$\xi_{CM} = \xi_{CM1}(X_{Ib}) + \xi_{CM2}(X_{tcont}) + \xi_{CM3}(X_{Tb}) + \xi_{CM4}(X_{\Delta U})$$

In the above formulas, $\xi_I$: coefficient of reliability of the actual current-basis battery charge status-estimation value $SOC_I$, $\xi_{CM}$: coefficient of reliability of the model-basis battery charge status-estimation value $SOC_{CM}$, $X_{Ib}$: reliability flag about magnitude of a charge-and-discharge current value (i.e., magnitude of load) (it is 1 in case of H in the above-mentioned Table 2, and 0 in case of L), $X_{tcont}$: reliability flag about a duration (same as the above) (it is 1 in case of H in the above-mentioned Table 2, and 0 in case of L), $X_{Tb}$: reliability flag about a battery temperature (same as the above) (it is 1 in case of H in the above-mentioned Table 2, and 0 in case of L), $X_{\Delta U}$: reliability flag about a OCV gradient (it is 1 in case of H in the above-mentioned Table 2, and 0 in case of L) and $\xi_{I1}, \xi_{I2}, \xi_{I3}, \xi_{I4}, \xi_{CM1}, \xi_{CM2}, \xi_{CM3}, \xi_{CM4}$: weighting coefficients (values beforehand stored in ROM or backup RAM: these values can be obtained beforehand by an experiment or a computer simulation).

Then, the processing proceeds to step 1140. In step 1140, the battery charge status-estimation value SOCe is computed based on the evaluation result in step 1130 by the SOCe calculating part 44. Specifically, in the present embodiment, the above-mentioned α is set up based on the values of the above-mentioned $\xi_I$ and $\xi_{CM}$, and a map beforehand stored in ROM or backup RAM (such a map can be beforehand obtained by an experiment or a computer simulation), and the battery charge status-estimation value SOCe is computed using this α.

Then, the processing proceeds to step 1150. In step 1150, it is judged whether the reduction of the reliability of the actual current-basis battery charge status-estimation value $SOC_I$ by the $SOC_I$ calculating part 41 reached a predetermined extent. Specifically, in the present embodiment, it is judged that "its reliability is low" when the coefficient-of-reliability $\xi_I$ is smaller than a predetermined value or the absolute value of (SOCe–$SOC_I$) is greater than a predetermined value.

When the reliability of the actual current-basis battery charge status-estimation value $SOC_I$ is evaluated low, (step 1150=Yes), the processing proceeds to step 1160. In step 1160, the actual current-basis battery charge status-estimation value $SOC_I$ is reset. Then, the processing of this routine is once completed.

On the other hand, the reliability of the actual current-basis battery charge status-estimation value $SOC_I$ is evaluated high, (step 1150=No), the processing proceeds to step 1170. In step 1170, it is judged whether the reduction of the reliability of the model-basis battery charge status-estimation value $SOC_{CM}$ by the $SOC_{CM}$ calculating part 42 reaches a predetermined extent. Specifically, in the present embodiment, it is judged that "its reliability is low" when the coefficient-of-reliability $\xi_{CM}$ is smaller than a predetermined value or the absolute value of (SOCe–$SOC_{CM}$) is greater than a predetermined value.

When the reliability of the model-basis battery charge status-estimation value $SOC_{CM}$ is low (step 1170=Yes), the processing proceeds to step 1180. In step 1180, the lithium concentration distribution in an active material is reset. Then, the processing of this routine is once completed.

On the other hand, when the reliability of the model-basis battery charge status-estimation value $SOC_{CM}$ is high (step 1170=No), the processing in step 1180 is skipped (i.e., the processing in steps 1160 and 1180 is not performed) and a processing of this routine is once completed.

Figure 12:
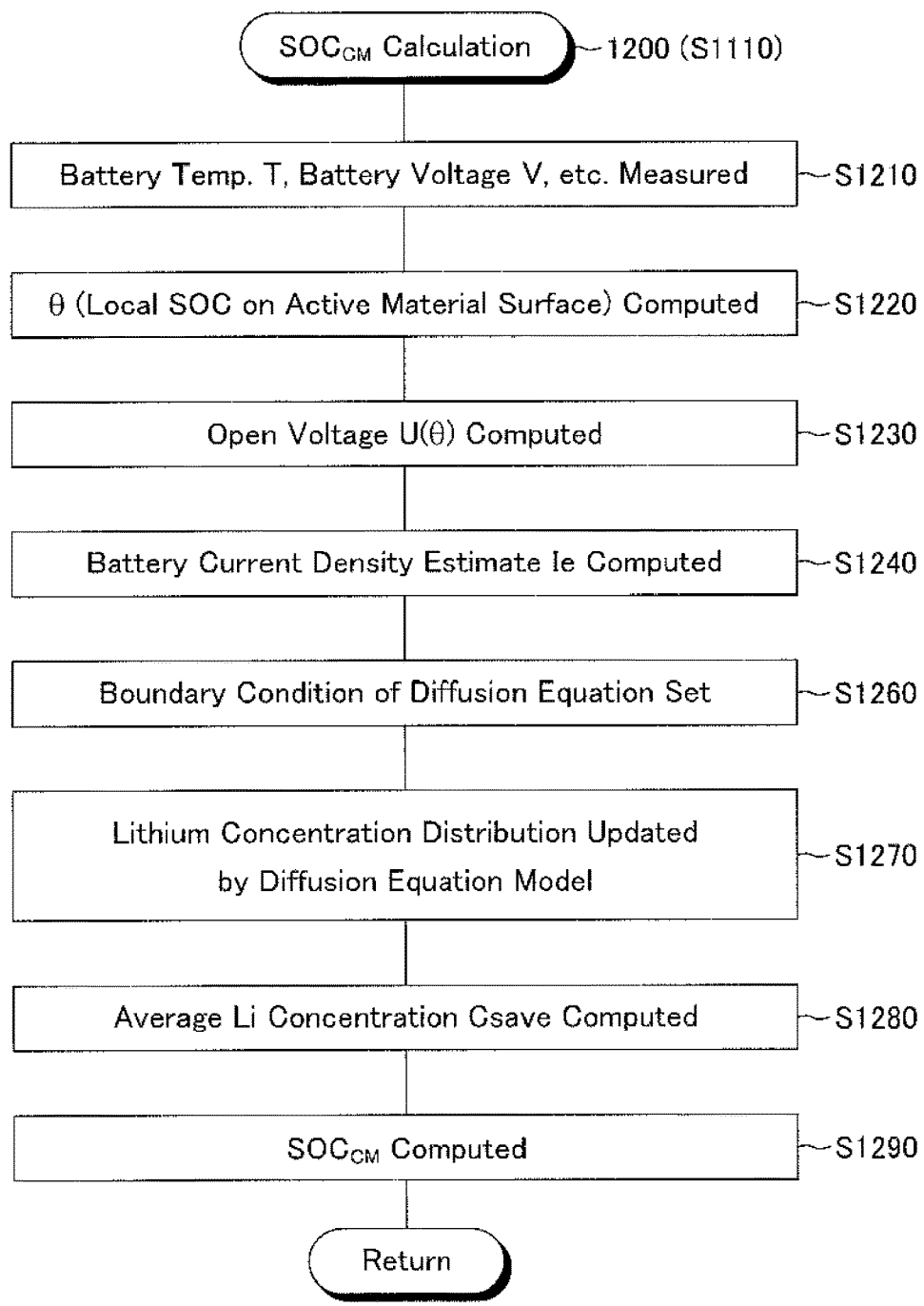
FIG. 12 A flowchart showing a calculating operation of a model-basis battery charge status-estimation value $SOC_{CM}$ by the $SOC_{CM}$ calculating part shown in FIG. 6.

FIG. 12 is a flowchart showing a calculating operation of the model-basis battery charge status-estimation value $SOC_{CM}$ by the $SOC_{CM}$ calculating part shown in FIG. 6. In addition, the following processing is the same as the processing in steps 100 to 172 in FIG. 12 of Japanese Patent No.

4872743 (Japanese Patent Application Laid-Open (kokai) No. 2008-243373) by the present applicant. Therefore, as for the contents of processing in the following steps 1210 and thereafter, only the outline will be explained.

Once this $SOC_{CM}$ calculation routine 1200 is started up, first, in step 1210, the battery temperature T and battery voltage V, etc. are acquired based on the detection values of various sensors (detection value Tb of temperature sensor 4d and the detection value Vb of the voltage sensor 4b, etc.). Next, in step 1220, the value (θ) of the local SOC on the surface of an active material is computed based on the lithium concentration distribution updated in step 1270 which will be mentioned later at the time of the last routine execution.

Then, the processing proceeds to step 1230. In step 1230, an open voltage U(θ) value is computed based on the value of the local SOC computed in the above-mentioned step 1220. Then, the processing proceeds to step 1240. In step 1240, the estimated battery current Ie is computed by the function of the current estimating part 424 shown in FIG. 7 based on the battery parameter values set up in accordance with the battery voltage V, the open voltage U(θ) and the battery temperature T.

Then, the processing proceeds to step 1260. In step 1260, a reaction-current density (the amount of lithium formation) is computed from the estimated battery current Ie, and the boundary condition in the active-material surface of a diffusion model equation (active-material surface) is set up using the computed reaction-current density.

Then, the processing proceeds to step 1270. In step 1270, the lithium concentration distribution in an active-material model is calculated in accordance with the diffusion-equation model, and the lithium concentration estimate in each region in an active-material model is updated. Namely, the processing performed in step 1270 is equivalent to the function of the diffusion estimating part 421 in FIG. 7. In addition, as mentioned above, the lithium concentration in a segmented region at the outermost circumference calculated and updated at this time is used for calculation of the local SOC in step 1220 at the time of the next routine execution.

After the lithium concentration distribution is updated in step 1270, the processing proceeds to step 1280. In step 1280, the lithium average concentration $C_{save}$ is computed based on the lithium concentration distribution in the active material acquired in step 1270.

Then, the processing proceeds to step 1290. In step 1290, the model-basis battery charge status-estimation value $SOC_{CM}$ is computed based on the lithium average concentration $C_{save}$ acquired in step 1280. Then, the processing of this routine is once completed. Namely, the processing proceeds to step 1120 in the routine 1100.

FIG. 13 is a flowchart showing a calculating operation of the actual current-basis battery charge status-estimation value $SOC_I$ by the $SOC_I$ calculating part shown in FIG. 6, which is performed in step 1120 in FIG. 11. In addition, since the content of the processing in step 1310 and later is already well-known as mentioned above, only the outline will be explained in the present specification.

Once this $SOC_{CM}$ calculation routine 1300 is started, first, in step 1310, the charge-and-discharge current actual value Ib (this will be referred to as the "sensor current Ib" hereafter. Same applies to FIG. 13) is acquired based on the output of the current sensor 4c.

Next, the processing proceeds to step 1320. In step 1320, an integrating processing of the sensor current Ib is performed. Then, the processing proceeds to step 1330. In step 1330, the actual current-basis battery charge status-estimation value $SOC_I$ is computed. And when the actual current-basis battery charge status-estimation value $SOC_I$ is computed in step 1330, the processing of this routine is once completed. Namely, the processing proceeds to step 1130 in a routine 1100.

—Exemplification of Modifications—

In addition, as mentioned above, the above-mentioned embodiments are only what the applicant tentatively exemplified as typical embodiments of the present invention which the applicant considered best at the time when filing the present application. Therefore, the present invention is not limited to the above-mentioned embodiment at all from the first. Therefore, it is a natural that various modifications may be applied to the above-mentioned embodiments unless the substantial part of the present invention is changed.

Hereafter, some typical modifications will be exemplified. In addition, in the explanation of the following modifications, the same symbol as the above-mentioned embodiments shall be attached to the member which has the same configuration and function as the above-mentioned embodiments, and as the explanation of such members, the explanation of the members with the same symbol as the above-mentioned embodiments shall be used suitably (unless technical inconsistency happens).

However, needless to say, the modifications are not limited to the following exemplification. Moreover, it is also needless to say that two or more modifications may be suitably and compositely applied unless technical inconsistency happens.

The present invention (especially, operationally or functionally expressed elements, among the constituent elements which constitute the measure for solving the problem of the present invention) must not be definitely interpreted based on the above-mentioned embodiments and the description of the following modifications. Such a limited interpretation unfairly injures the profit of an applicant (who hurries to file an application under the first-to-file principle), while it benefits an imitator unfairly, and therefore it should be not allowed.

The present invention is not limited to the specific device configuration disclosed in the above-mentioned embodiments. For instance, one of the primary motor generator 21 and the secondary motor generators 22 may be omitted. Moreover, the subject to which the present invention is applied is not limited to a hybrid vehicle. Namely, for example, the present invention may be successfully applied to an electric vehicle which does not use an internal-combustion engine. Furthermore, the subject to which the present invention is applied is not limited to vehicles at all.

The present invention is not limited to the specific processing mode disclosed in the above-mentioned embodiments. For example, as the calculating method of the actual current-basis battery charge status-estimation value $SOC_I$ by the $SOC_I$ calculating part 41, and the calculating method of the battery charge status-estimation value SOCe by the SOCe calculating part 44, those described in Japanese Patent Application Laid-Open (kokai) No. H11-223665, Japanese Patent Application Laid-Open (kokai) No. 2000-150003, Japanese Patent Application Laid-Open (kokai) No. 2005-201743 and Japanese Patent Application Laid-Open (kokai) No. 2008-243373, etc. may be used.

The reset value $SOC_{I\_reset}$ of the actual current-basis battery charge status-estimation value $SOC_I$ may be the model-basis battery charge status-estimation value $SOC_{CM}$ at the time, and may be the battery charge status-estimation value SOCe at the time.

The order of steps in the above-mentioned specific example (flowchart) may be changed suitably. Namely, for example, step 550 in the above-mentioned routine 500 shown in FIG. 5 may be performed before step 520. Specifically, step 550 may be performed as a part of step 510. Similarly, the order of step 1110 and step 1120 in the above-mentioned routine 1100 shown in FIG. 11 does not matter in particular.

Moreover, in the above-mentioned routine 1100, step 1110 may be considered as "an acquisition of a $SOC_{CM}$ calculated value", step 1120 may be considered as "an acquisition of a $SOC_I$ calculated value", the routine 1100 may be performed immediately after the execution of routines 1200 and 1300, and the battery ECU4a may be configured to perform the executions of routines 1200, 1300 and 1000 every predetermined operation period (for instance, 0.1 second). In addition, the time required for execution of routines 1200, 1300 and 1000 is much shorter than the above-mentioned operation period. Therefore, in this case, calculation of the actual current-basis battery charge status-estimation value $SOC_I$, calculation of the model-basis battery charge status-estimation value $SOC_{CM}$ and calculation of the battery charge status-estimation value SOCe are seemingly performed almost simultaneously and every above-mentioned operation period.

Neither the evaluation of the reliability of the actual current-basis battery charge status-estimation value $SOC_I$ and the model-basis battery charge status-estimation value $SOC_{CM}$ nor the evaluation of the reliability of the estimated battery current Ie and the sensor current Ib is limited to the above-mentioned specific examples at all. Specifically, as factors taken into consideration on this evaluation, a part of the above-mentioned factors (for instance, only the sensor current Ib and battery temperature) may be used, and factors other than the above-mentioned factors may be used.

The subject to which the present invention is applied is not limited to what is called a "battery model" dealing with a lithium diffusion behavior. For example, the present invention may be suitably applied also to an embodiment using what is called an "equivalent circuit model" as described in Japanese Patent Application Laid-Open (kokai) No. 2000-268886, Japanese Patent Application Laid-Open (kokai) No. 2003-75518, Japanese Patent Application Laid-Open (kokai) No. 2007-178215 and Japanese Patent Application Laid-Open (kokai) No. 2011-215151, etc.

In addition, it is a natural that any modifications which have not been mentioned by special are included in the scope of the present invention unless a substantial part of the present invention is changed.

Moreover, the operationally or functionally expressed elements, among the elements which constitute the measure for solving the problem of the present invention includes any structures which can attain the operation or function, in addition to the specific structures disclosed in the above-mentioned embodiments and modifications. Furthermore, the contents of each of the official gazettes cited in the present specifications (including their specification and drawings) may be suitably used to constitute a part of the present specification.

REFERENCE SIGNS LIST

S: Electric Power System, VH: Electric Motor-mounted vehicle, 1: Secondary Battery, 2: Load Mechanism, 3: Main Control Unit, 4: Battery Controller, 4a: Electronic Control Unit for Battery Control, 4b: Voltage Sensor, 4c: Current Sensor, 4d: Temperature Sensor, 40: Battery Status Estimating Device, 40a: Diffusion Estimating Part, 40b: Open Voltage Estimating Part, 40c: Battery Parameter-values Setting part, 40d: Boundary-condition Setting Part, 40e: Average Concentration Calculating Part, 40f: Current Input Unit, 40/1: Model Estimated Current Calculating Part, 40/2: Current Reliability Evaluating Part, 40/3: Model Input Current Calculating Part, 40g: SOC Estimating Part, 41: $SOC_I$ Calculating Part, 42: $SOC_{CM}$ Calculating Part, 421: Diffusion Estimating Part, 422: Open Voltage Estimating Part, 423: Battery Parameter-values Setting Part, 424: Current Estimating Part, 425: Boundary-condition Setting Part, 426: Average Concentration Calculating Part, 427: Model-basis Estimated SOC Calculating Part, 428: Current Input Unit, 429: SOC Estimating Part, 43: SOC Reliability Evaluating Part, 44: SOCe Calculating Part, 45: $SOC_I$ Resetting Part and 46: $SOC_{CM}$ Resetting Part.

What is claimed is:

1. A battery status estimating device configured so as to estimate charge status of a secondary battery configured to provide electric power to a vehicle motor, the battery status estimating device comprising:

a voltage detector that detects a battery voltage between terminals of said secondary battery, a current detector that detects a current under charge and discharge of said secondary battery, a temperature detector that detects a battery temperature of said secondary battery, and at least one microprocessor comprising:

an open voltage estimating part configured to estimate an open voltage of the secondary battery, a current estimating part that calculates an estimated current of said secondary battery, based on said battery voltage detected by said voltage detector and said open voltage estimated by said open voltage estimating part, a reliability evaluating part which evaluates a reliability of a detection value of said current by said current detector and a reliability of said estimated current by said current estimating part based on a measurement of a charge-and-discharge duration from a last time when calculation of the estimated current of said secondary battery is initiated, said open voltage estimated by said open voltage estimating part and said battery temperature detected by said temperature detector, a model input current calculating part which computes a model input current which is a current value used for the estimation of said charge status using a computational model, based on said current estimated by the current estimating part, said current detected by said current detector, and said reliability of said detection value of said current by said current detector, and said reliability of said estimated current by said current estimating part, and a first charge status-estimating part which estimates said charge status as a first estimated charge status, using said computational model based on said model input current computed by said model input current calculating part in accordance with said evaluation result, a second charge status-estimating part which estimates said charge status as a second estimated charge status, based on said detected battery voltage, and said detected battery temperature, and a status of charge resetting part which, in response to a deviation between the first estimated charge status and the second estimated charge status exceeding a predetermined value, resets the first charge status-estimating part so that the first charge status-estimating part continues to estimate said charge status based on said battery voltage detected by said voltage detector, said current detected by said current detector, and said battery temperature detected by said temperature detector, from a reset value that is generated based on the second estimated charge status, wherein the least one microprocessor controls a charge-and-discharge operation of the secondary battery and an operation of the vehicle motor based on said charge status estimated by the first charge status-estimating part from the reset value, in response to the deviation between the first estimated charge status and the second estimated charge status exceeding the predetermined value.

2. A battery status estimating device configured so as to detect charge status of a secondary battery configured to provide electric power to a vehicle motor, the battery status estimating device comprising:

a voltage detector that detects a battery voltage between terminals of said secondary battery, a current detector that detects a current under charge and discharge of said secondary battery, a temperature detector that detects a battery temperature said secondary battery, and at least one microprocessor comprising:

an open voltage estimating part configured to estimate an open voltage of the secondary battery, a primary estimate calculating part which sequentially computes a primary estimate that is an estimate of said charge status based on a detection value of said current by said current detector, a secondary estimate calculating part which sequentially computes a secondary estimate that is an estimate of said charge status using a computational model, based on said battery voltage detected by said voltage detector and said open voltage estimated by said open voltage estimating part, a reliability evaluating part which evaluates reliabilities of said primary estimate and said secondary estimate based on a measurement of a charge-and-discharge duration from a last time when calculation of the estimated current of said secondary battery is initiated, said open voltage estimated by said open voltage estimating part and said battery temperature detected by said temperature detector, a primary estimate resetting part which resets said primary estimate calculating part in response to said reliability evaluating part evaluating the reliability of said primary estimate as low so as to continue a sequential calculation of said primary estimate from a primary reset value, and a secondary estimate resetting part which resets said secondary estimate calculating part in response to said reliability evaluating part evaluating the reliability of said secondary estimate as low so as to continue a sequential calculation from a second reset value wherein the least one microprocessor controls a charge-and-discharge operation of the secondary battery and an operation of the vehicle motor based on said primary estimate and said secondary estimate.

3. The battery status estimating device according to claim 2, wherein the at least one microprocessor further comprises:

a charge status calculating part which estimates said charge status by weighing said primary estimate and said secondary estimate using coefficients set up based on the evaluation result of the reliabilities of said primary estimate and said secondary estimate by said reliability evaluating part.

4. The battery status estimating device according to claim 3, characterized in that:

said secondary estimate calculating part computes said secondary estimate based on said battery voltage detected by said voltage detector and said battery temperature detected by said temperature detector by using a battery model as said computational model which contains at least a diffusion equation specifying a distribution of a reaction contributing substance that is a substance contributing to an electrochemical reaction in said secondary battery to estimate a concentration distribution and an average concentration of the reaction contributing substance in an active material including said reaction contributing substance therein, and said secondary estimate resetting part updates said concentration distribution based on said primary estimate.

5. The battery status estimating device according to claim 2, characterized in that:

said secondary estimate calculating part is prepared so as to compute said secondary estimate based on said battery voltage detected by said voltage detector and said battery temperature detected by said temperature detector by using a battery model as said computational model which contains at least a diffusion equation specifying a distribution of a reaction contributing substance that is a substance contributing to an electrochemical reaction in said secondary battery to estimate a concentration distribution and an average concentration of the reaction contributing substance in an active material including said reaction contributing substance therein, and said secondary estimate resetting part updates said concentration distribution based on said primary estimate.

6. The battery status estimating device according to claim 4, characterized in that:

said secondary estimate resetting part updates the average concentration, while resetting the instantaneous concentration distribution.

* * * * *